US012587178B1

(12) United States Patent
Roham et al.

(10) Patent No.: US 12,587,178 B1
(45) Date of Patent: Mar. 24, 2026

(54) HIGH SPEED, LOW POWER HYBRID DESERIALIZER FOR CHIPLET-TO-CHIPLET COMMUNICATION

(71) Applicant: QUALCOMM Incorporated, San Diego, CA (US)

(72) Inventors: Masoud Roham, San Diego, CA (US); Thomas Hua-Min Williams, Irvine, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 18/894,642

(22) Filed: Sep. 24, 2024

(51) Int. Cl.
    *H03K 3/037*     (2006.01)
    *G06F 1/08*     (2006.01)
(52) U.S. Cl.
    CPC .............. *H03K 3/037* (2013.01); *G06F 1/08* (2013.01)
(58) Field of Classification Search
    CPC ....... H03K 19/17736; H03K 19/17728; H03K 5/135; H03K 19/1737; H03K 3/037; H03K 19/17704; H03K 19/1776; H03K 19/20; H03K 3/0372; H03K 3/84; H03K 19/21; H03K 7/08; H03K 23/667; H03K 21/10; H03K 5/1252; H03K 5/26; H03K 3/012; H03K 3/0375; H03K 19/17792; H03K 5/133; H03K 19/1736; H03K 19/0016; H03K 21/00; H03K 5/14; H03K 5/1565; H03K 17/005; H03K 19/1774; H03K 19/17764; H03K 2005/00058; H03K 21/023; H03K 21/026; H03K 21/08; H03K 23/56; H03K 23/665; H03K 3/35625; H03K 21/38; H03K 5/131; H03K 19/09429; H03K 19/1778; H03K 19/17796; H03K 23/68; H03K 19/003; H03K 19/17748;

(Continued)

(56) References Cited

U.S. PATENT DOCUMENTS 4,802,136 A    1/1989  Nose et al.
6,292,038 B1 *  9/2001  Stachura .............. H03K 5/1252
                            327/144

(Continued)

OTHER PUBLICATIONS

International Search Report and Written Opinion—PCT/US2025/045782—ISA/EPO—Jan. 15, 2026.

(Continued)

*Primary Examiner* — John W Poos
(74) *Attorney, Agent, or Firm* — Loza & Loza, LLP

(57)          ABSTRACT

A data conversion circuit has first cascaded flipflops, second cascaded flipflops and a first selection circuit. The first cascaded flipflops include a plurality of series-coupled dynamic flipflops configured to convert first data to second data. Each dynamic flipflop is configured to retain signaling state of its output based on a capacitance at its input. The second cascaded flipflops include a plurality of series-coupled static flipflops configured to convert the first data to the second data. Each static flipflop is configured to retain signaling state of its output through a feedback circuit that actively drives its input. The first selection circuit is configured to select between an output of the first cascaded flipflops and an output of the second cascaded flipflops to provide the second data based on frequency of a clock signal that controls a rate at which data is shifted through the data conversion circuit.

20 Claims, 12 Drawing Sheets

(58) Field of Classification Search

CPC ........ H03K 23/58; H03K 23/62; H03K 23/00; H03K 3/0307; H03K 3/0315; H03K 3/356008; H03K 21/40; H03K 23/54; H03K 5/00006; H03K 19/00323; H03K 5/13; H03K 19/018592; H03K 19/096; H03K 19/177; H03K 19/17732; H03K 19/17744; H03K 23/70; H03K 3/356121; H03K 23/50; H03K 23/66; H03K 3/017; H03K 3/289; H03K 5/1534; H03K 5/19; H03K 17/693; H03K 2005/00019; H03K 2005/00286; H03K 23/005; H03K 23/544; H03K 5/15093; H03K 5/156; H03K 17/22; H03K 19/17768; H03K 2005/00234; H03K 23/004; H03K 23/425; H03K 3/013; H03K 3/0322; H03K 3/354; H03K 3/356139; H03K 3/356147; H03K 3/3562; H03K 5/06; H03K 5/15066; H03K 5/1515; H03K 17/6872; H03K 19/00315; H03K 19/086; H03K 19/1732; H03K 2005/00241; H03K 21/02; H03K 23/002; H03K 23/662; H03K 3/0377; H03K 3/3565; H03K 4/08; H03K 5/04; H03K 5/15033; H03K 5/1508; H03K 5/159; H03K 19/1733; H03K 19/215; H03K 21/406; H03K 2217/94021; H03K 23/40; H03K 23/502; H03K 23/586; H03K 23/82; H03K 3/011; H03K 3/03; H03K 3/2885; H03K 3/356113; H03K 3/356156; H03K 3/356182; H03K 5/01; H03K 5/05; H03K 5/1506; H03K 5/2427; H03K 17/223; H03K 17/6264; H03K 17/687; H03K 19/0008; H03K 19/001; H03K 19/017; H03K 19/0185; H03K 19/018507; H03K 19/0866; H03K 19/17772; H03K 19/18; H03K 19/212; H03K 2005/00032; H03K 2005/00039; H03K 2005/00071; H03K 2005/00078; H03K 2005/00084; H03K 2005/00156; H03K 23/507; H03K 23/588; H03K 23/64; H03K 3/00; H03K 3/356; H03K 3/356191; H03K 3/59; H03K 5/00; H03K 5/1502; H03K 5/15026; H03K 5/24; H03K 7/06; H03K 12/00; H03K 17/08108; H03K 17/0822; H03K 17/28; H03K 17/6874; H03K 17/79; H03K 17/88; H03K 19/00361; H03K 19/017545; H03K 19/084; H03K 19/091; H03K 19/09425; H03K 19/0963; H03K 19/17716; H03K 2005/00247; H03K 21/403; H03K 23/44; H03K 23/52; H03K 25/00; H03K 3/0231; H03K 3/2893; H03K 3/356173; H03K 3/78; H03K 5/084; H03K 5/15046; H03K 17/063; H03K 17/18; H03K 17/725; H03K 17/81; H03K 17/941; H03K 17/962; H03K 19/00; H03K 19/0013; H03K 19/00346; H03K 19/01; H03K 19/0175; H03K 19/01855; H03K 19/0813; H03K 19/082; H03K 19/0823; H03K 19/09443; H03K 19/12; H03K 19/14; H03K 19/173; H03K 19/17724; H03K 19/17788; H03K 2005/0011; H03K 2005/0015; H03K 2005/0026; H03K 21/18; H03K 2217/0036; H03K 23/42; H03K 23/505; H03K 23/542; H03K 23/548; H03K 23/60; H03K 23/76; H03K 23/86; H03K 3/02; H03K 3/023; H03K 3/0232; H03K 3/02337; H03K 3/027; H03K 3/04; H03K 3/288; H03K 3/30; H03K 3/356043; H03K 3/35606; H03K 3/356104; H03K 3/36; H03K 3/42; H03K 3/45; H03K 3/66; H03K 3/80; H03K 3/86; H03K 4/02; H03K 5/02; H03K 5/086; H03K 5/12; H03K 5/2481

See application file for complete search history.

(56) References Cited

U.S. PATENT DOCUMENTS

| | | | | |
|---|---|---|---|---|
| 6,819,150 | B1 * | 11/2004 | Santosa | G06F 1/324 |
| | | | | 327/144 |
| 7,961,012 | B2 * | 6/2011 | Hong | G06F 1/10 |
| | | | | 375/354 |
| 9,461,633 | B1 | 10/2016 | Foroudi | |
| 9,697,309 | B1 * | 7/2017 | Fung | H03K 3/0375 |
| 10,879,909 | B2 * | 12/2020 | Crepaldi | H03L 7/085 |
| 2002/0135408 | A1 * | 9/2002 | Chiu | H03K 5/1252 |
| | | | | 375/373 |

OTHER PUBLICATIONS

Sangirov J., et al., "Low-power and High-speed SerDes with nEw Dynamic Latch and Flip-flop for Optical Interconnect in 180 nm CMOS Technology", Optoelectronic Interconnects and Component Integration Xi, SPIE, 1000 20th St. Bellingham, WA 98225-6705 USA, vol. 7944, No. 1, Feb. 10, 2011, pp. 1-8, XP060020701, figures 5,8.

* cited by examiner

100

110

120

1200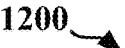

Data Conversion

1202

Select a mode of operation for the data conversion circuit based on frequency of a clock signal that controls a rate at which data is to be shifted through the data conversion circuit

1204

Enable first cascaded flipflops to convert first data to second data in a first mode of operation, the first cascaded flipflops comprising a plurality of series-coupled dynamic flipflops, each dynamic flipflop being configured to retain signaling state of its output based on a capacitance at its input

1206

Configure a first selection circuit to select an output of the first cascaded flipflops as an output of the data conversion circuit in the first mode of operation

1208

Enable second cascaded flipflops to convert the first data to the second data in a second mode of operation, the second cascaded flipflops comprising a plurality of series-coupled static flipflops, each static flipflop being configured to retain signaling state of its output through a feedback circuit that actively drives its input

1210

Configure the first selection circuit to select an output of the second cascaded flipflops as the output of the data conversion circuit in the second mode of operation

*FIG. 12*

HIGH SPEED, LOW POWER HYBRID DESERIALIZER FOR CHIPLET-TO-CHIPLET COMMUNICATION

TECHNICAL FIELD

The present disclosure generally relates to serializer and deserializer circuits and, more particularly, to serializer and deserializer circuits implemented using a combination of static and dynamic flipflops.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Increasingly, chiplets are employed to implement system-on-a-chip (SoC) devices that can accommodate ever increasing complexity. SoCs typically use multiple high-speed bus interfaces for communication of signals between chiplets.

High-speed serial buses offer advantages over parallel communication links when, for example, there is demand for reduced power consumption and smaller footprints in integrated circuit (IC) devices. In a serial interface, data is converted from parallel words to a serial stream of bits using a serializer and is converted back to parallel words at the receiver using a deserializer. A serializer/deserializer (SERDES) may be used to transmit and receive data through a serial communication link. Increasingly, chiplets are expected to support very high data-rate communications. In some examples, the aggregate rate of data communication within an SoC or between chiplets can exceed several terabits per second (Tb/s) with resultant high power consumption and interface complexity. Therefore, there is an ongoing need for new techniques that provide reliable lower-power serializers and deserializers for use in high-speed serial data communication links.

SUMMARY

Certain aspects of the disclosure relate to IC devices that include a data conversion circuit in a bus interface. In one aspect, the bus interface includes a serializer circuit and the bus interface can be configured to operate with a scalable clock frequency.

In various aspects of the disclosure, a data conversion circuit has first cascaded flipflops, second cascaded flipflops and a first selection circuit. The first cascaded flipflops include a plurality of series-coupled dynamic flipflops configured to convert first data to second data. Each dynamic flipflop is configured to retain signaling state of its output based on a capacitance at its input. The second cascaded flipflops include a plurality of series-coupled static flipflops configured to convert the first data to the second data. Each static flipflop is configured to retain signaling state of its output through a feedback circuit that actively drives its input. The first selection circuit is configured to select between an output of the first cascaded flipflops and an output of the second cascaded flipflops to provide the second data based on frequency of a clock signal that controls a rate at which data is shifted through the data conversion circuit.

In various aspects of the disclosure, a method for configuring a data conversion circuit includes selecting a mode of operation for the data conversion circuit based on frequency of a clock signal that controls a rate at which data is to be shifted through the data conversion circuit, enabling first cascaded flipflops to convert first data to second data in a first mode of operation, configuring a first selection circuit to select an output of the first cascaded flipflops as an output of the data conversion circuit in the first mode of operation, enabling second cascaded flipflops to convert the first data to the second data in a second mode of operation, and configuring the first selection circuit to select an output of the second cascaded flipflops as the output of the data conversion circuit in the second mode of operation. The first cascaded flipflops may include a plurality of series-coupled dynamic flipflops. Each dynamic flipflop may be configured to retain signaling state of its output based on a capacitance at its input. The second cascaded flipflops may include a plurality of series-coupled static flipflops. Each static flipflop may be configured to retain signaling state of its output through a feedback circuit that actively drives its input.

In various aspects of the disclosure, an apparatus includes means for selecting between first cascaded flipflops and second cascaded flipflops to convert first data to second data, and means for selecting an output of a data conversion circuit from an output of the first cascaded flipflops and an output of the second cascaded flipflops. The first cascaded flipflops may include a plurality of series-coupled dynamic flipflops. Each dynamic flipflop may be configured to retain signaling state of its output based on a capacitance at its input. The second cascaded flipflops may include a plurality of series-coupled static flipflops. Each static flipflop may be configured to retain signaling state of its output through a feedback circuit that actively drives its input. The means for selecting between first cascaded flipflops may be controlled by a signal indicating frequency of a clock signal that controls a rate at which data is to be shifted through the data conversion circuit. The means for selecting the output of a data conversion circuit may be controlled by a signal indicating frequency of a clock signal that controls a rate at which data is to be shifted through the data conversion circuit.

In certain aspects, a second selection circuit is configured to select between an input of the first cascaded flipflops and an input of the second cascaded flipflops to receive the first data based on the frequency of the clock signal that controls the rate at which data is shifted through the data conversion circuit.

In certain aspects, each of the first cascaded flipflops includes a dynamic flipflop portion that is series-coupled to a static flipflop portion. The capacitance at the input of each dynamic flipflop includes a parasitic capacitance. The data conversion circuit may be configured to operate as a serializer. The data conversion circuit may be configured to operate as a deserializer.

In certain aspects, delay circuits are configured to provide a plurality of delayed versions of the first data to corresponding groups of cascaded flipflops. Each group of cascaded flipflops may include two or more dynamic flipflops or two or more static flipflops. The first selection circuit may be configured to select the output of the first cascaded flipflops to provide the output of the data conversion circuit when the clock signal has a frequency that exceeds 1 GHz.

BRIEF DESCRIPTION OF THE DRAWINGS

FIG. 12 is a flowchart of a method for configuring a data conversion circuit in accordance with certain aspects of this disclosure.

DETAILED DESCRIPTION

Figure 1:
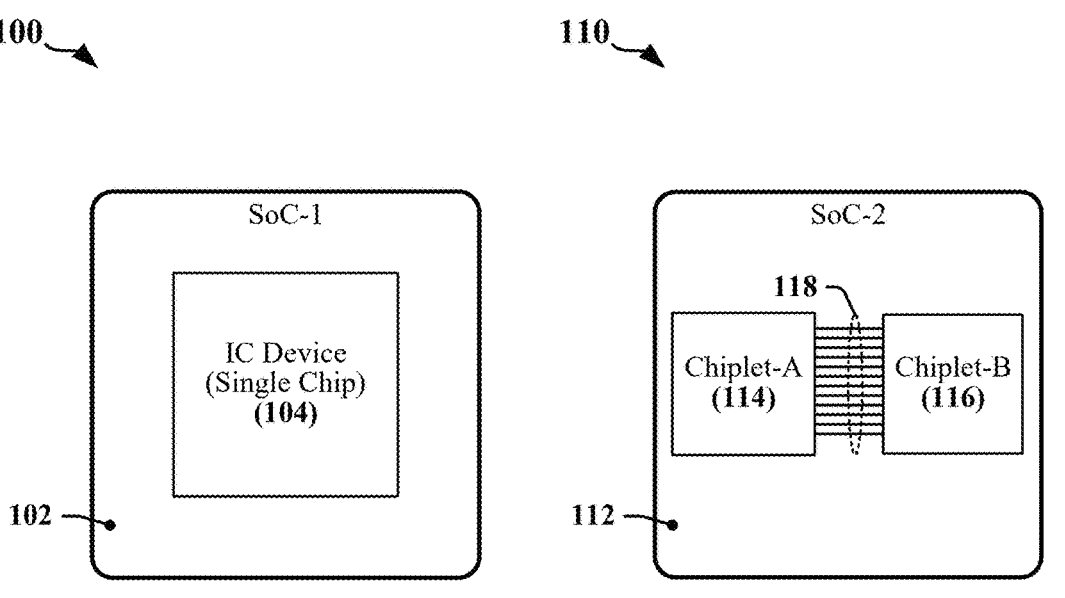
FIG. 1 illustrates examples of system-on-a-chip configurations that may be adapted in accordance with certain aspects of the present disclosure.
Figure 1:
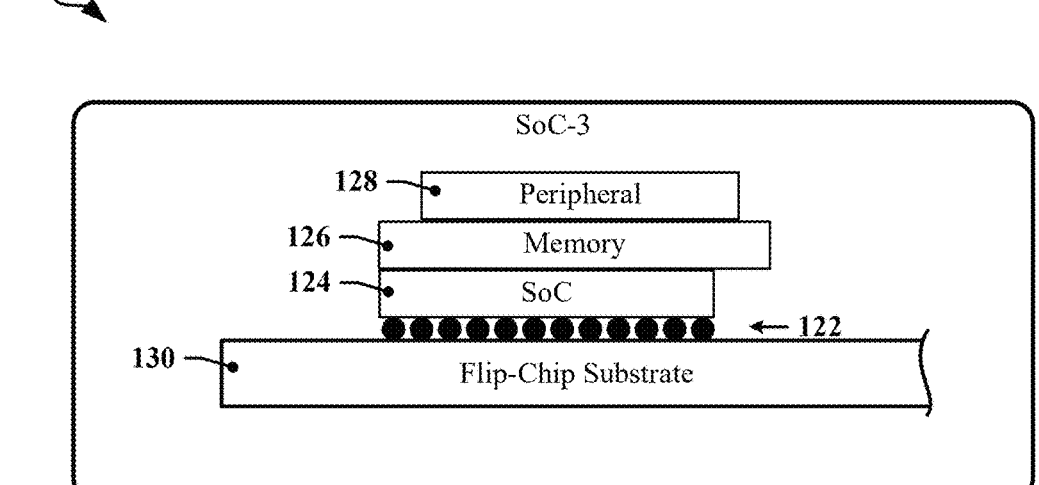

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of the invention will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

Data communication links may be employed by a system-on-a-chip (SoC) or another type of IC device to connect processors with modems and other peripherals. A data communication links may be operated in accordance with industry or proprietary standards or protocols associated with certain functions or types of devices. According to certain aspects of the disclosure, a serial data link may be used to interconnect electronic devices that are subcomponents of an apparatus such as a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, a wearable computing device (e.g., a smart watch, a health or fitness tracker, eyewear, etc.), an appliance, a sensor, a security device, a vending machine, a smart meter, a drone, a multicopter, or any other similar functioning device.

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

Certain examples of clock generation circuits are disclosed herein. Certain clock generation circuits are illustrated as being implemented using certain combinations of P-type metal-oxide-semiconductor (PMOS) transistors and N-type metal-oxide-semiconductor (NMOS) transistors. These circuits are provided by way of example only, and it is contemplated that the concepts disclosed herein can be implemented in circuits that use different combinations of NMOS and PMOS transistors or complementary metal-oxide-semiconductor (CMOS) digital circuits. Circuits that include NMOS, PMOS or CMOS transistors are typically coupled to the rails of a power supply. The power supply provides a current that flows from a higher voltage rail to a lower voltage rail. A rail may include some combination of conductors, wires, connectors and other types of interconnect. For the purposes of this description, the higher voltage rail may be referenced as "VDD" or "VDD" and the lower voltage rail may be referred to as Ground.

In some implementations, power may be provided to certain circuits through more than two rails.

FIG. 1 illustrates devices that include a system-on-a-chip (SoC) 100, 110, 120 that may be adapted in accordance with certain aspects of the present disclosure. All, or substantially all of the circuits and components of a conventional SoC 100 may be provided within a single integrated circuit (IC) device 104 mounted on a substrate 102. The IC device 104 may be coupled to external circuits through pins, wires, solder pads or other input/output (I/O) connectors. In order to meet the demand for greater functionality, the size of a typical IC device 104 has increased over time to accommodate the increased complexity circuits within the SoC 100. The increased size and complexity can reduce manufacturing yields and can increase cost. In many applications, yields can be improved by separating functional elements of the single IC device 104 into multiple smaller IC devices, which may be referred to as "chiplets." SoCs implemented using chiplets can accommodate more complex and larger circuits with reasonable yields. In some instances, yields can be improved by concentrating more advanced and higher cost technology nodes into one group of chiplets, while other chiplets can be manufactured using more conventional technology nodes to support lower-speed or less critical circuits. Chiplet-based SoCs are increasingly used in automotive, complex computational and mobile communication device applications.

A first example of a chiplet-based SoC 110 includes two or more chiplets 114, 116 mounted on a substrate 112. In this example, interconnects 118 may be provided to couple the chiplets 114, 116. The interconnects 118 may carry power, control signals and/or may implement one or more data communication links. The chiplets 114, 116 may be further coupled to external circuits through pins, wires solder pads or other I/O connectors.

A second example of a chiplet-based SoC 120 includes chiplets 124, 126, 128 that are stacked vertically on a substrate 130. Some chiplets can be included in stacks that are deployed across the surface of the substrate 130, while other chiplets may be individually mounted on the surface of the substrate 130. Chiplets may be mounted on the surface of the substrate 130 using solder balls 122 that provide electrical and/or thermal coupling between the substrate 130 and the mounted chiplets 124, 126, 128. An interconnect structure may be formed that enables the chiplets 124, 126, 128 in a stack of chiplets to communicate with one another, with other chiplets mounted on the substrate 130 and with I/O structures that couple the SoC 200 with other circuits, displays, imaging sensors and other peripherals with an apparatus. In some implementations, an SoC (not illustrated) may include some combination of chiplets that are mounted across a substrate and chiplets that are vertically stacked with respect to the substrate.

The use of stacked chiplets can reduce the areal size of the substrate 130 and increase three-dimensional packing density. The constituent chiplets may provide complex features and high performance within a smaller form-factor operated at lower power specifications. Moreover, each chiplet may define multiple power domains, operate at different frequencies and different chiplets may manage power/frequency modes independently and. In some instances, two or more chiplets may be operated in mutually exclusive power states. Additionally, operating conditions for an SoC depend on the type, number and arrangement of chiplets included on the substrate in addition to the modes of operation defined by applications. It is necessary to consider power usage by all chiplets in the SoC in order to ensure compliance with power budgets assigned for an application or device.

Increasingly, chiplets are expected to support very high data-rate communications. In some examples, the aggregate rate of data communication within an SoC or between chiplets can exceed several terabits per second (Tb/s). Hundreds or thousands of interconnects may be implemented to support such data rates. The communication between the chips requires high-speed, low-power, low-latency links. Conventional chiplet-based implementations suffer from limitations that include complex or difficult interconnect routing, local hotspots arising from routing congestion caused by connection architecture, and challenges to signal timing specifications. In certain examples, local hotspots can arise from routing congestion, increased feature complexity and circuit concentrations. In certain examples, signal timing specifications can be compromised due to the necessity for an increased number of isolation clamps due to logic placement, number of voltage domains and reduced floorplan. Long wire crossings between chiplets can cause routing congestion and lossy interconnects.

Each chiplet in an SoC may be included to perform a specific function or type of function and the configuration of the chiplets can introduce further complexities and challenges for designers. For example, one chiplet may include radio frequency front end circuits that produce high frequency signals ranging up to 5 gigahertz (5 GHZ) or more, and may further include interfaces that are used by low-frequency power management circuits. A designer may import previously defined circuit blocks to implement some of the internal functions. These circuit blocks may be referred to as macros. Imported circuit blocks for a given process technology may be described, characterized or defined by a set of masks, hardware description language, specifications and test data. Commercially available or proprietary circuit blocks may be referred to as hard macros. Hard macros are tested and verified for a set of design and operating specifications. It is common for hard macros and other circuit blocks to define multiple power domains.

The Universal Chiplet Interconnect Express (UCIe) is an example of a standardized chiplet interconnect specification. The UCIe specification enables construction of large System-on-Chip (SoC) packages that, in aggregate, can exceed the maximum reticle size. The adoption of the UCIe specification has facilitated the integration of chiplets manufactured by different vendors into a single package. The UCIe specification enables the integration of chiplets fabricated using different silicon manufacturing processes into a single package, as required or desired for a specific device type, computing performance and/or to better meet power consumption budgets. The UCIe specification defines physical layer circuits and interconnects, protocol stacks and defines a software architecture and procedures to be used for compliance testing.

The UCIe specification defines different packaging options. One packaging option is the standard packaging option, which may also be referred to as the two-dimensional (2D) option. The standard packaging option may be applied to technology that can be used for low-cost devices and long-reach channels, where distances of between 10 mm and 25 mm may be considered to be long-reach. Another packaging option is the advanced packaging option, which may also be referred to as the 2.5D option. The advanced packaging option may be applied to technology that can be used for performance-optimized applications with short channel lengths. For example, channels that have a length that is less than 2 mm may be considered to be a short channel.

Figure 2:
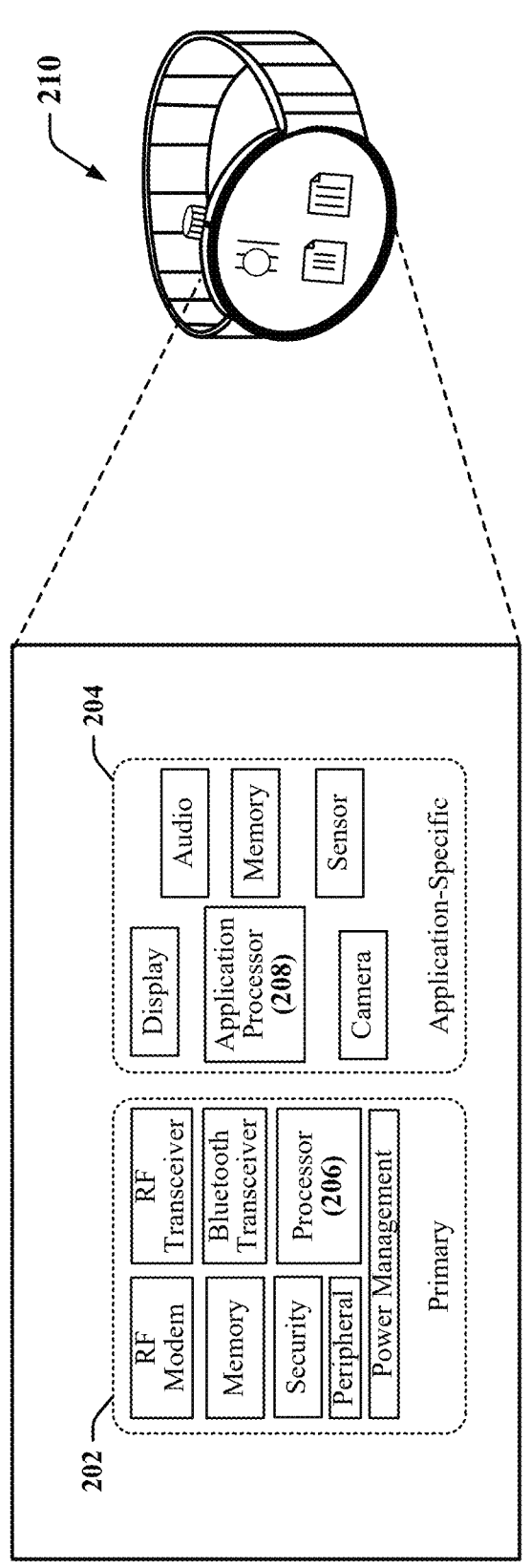
FIG. 2 illustrates an apparatus employing interconnected chiplets.

FIG. 2 illustrates an example of an apparatus 200 in which certain components are implemented using multiple chiplets that are interconnected using one or more data communication buses. In one example, the apparatus 200 may be enclosed within a wearable device a portable or wearable processing and/or communication device (each of which being referred to herein as a portable communication device or PCD), sensors, instruments, appliances and other such devices include one or more ICs. These devices may include mobile phones, tablet computers, palmtop computers, portable digital assistants (PDAs), portable game consoles, and other portable electronic devices such as the illustrated smartwatch 210. PCDs commonly contain integrated circuits or SoCs that include numerous components or subsystems designed to work together to deliver functionality to a user. The various SoC subsystems may communicate with each other via one or more intra-chip data buses or similar data communication interconnects. PCDs may have multiple SoCs that communicate with each other via similar inter-chip interconnects. The ICs are typically packaged in an IC package, which may be referred to as a "semiconductor package" or "chip package." The IC package typically includes a package substrate and one or more IC chips or other electronic modules mounted to the package substrate to provide electrical connectivity to the IC chips. For example, an IC chip in an IC package may be configured as an SoC. The IC chips are electrically coupled to other IC chips and/or to other components in the IC package through electrical coupling to metal lines in the package substrate. The IC chips can also be electrically coupled to other circuits outside the IC package through electrical connections of external metal interconnects (e.g., solder bumps) of the IC package.

Chiplet technology can be used to address some of the performance, power and size design requirements for complex SoCs used in certain mobile or wearable devices. The apparatus 200 may be configured by selecting a combination of chiplets that implement certain subsystems or distinct functional elements. In the illustrated example, the apparatus 200 includes a set of primary chiplets 202 that enable the apparatus 200 to perform core processing, security and communication functions. The set of primary chiplets 202 include a processor, memory and one or more modems. The illustrated apparatus 200 also includes a set of application-specific chiplets 204 that includes an application processor, display driver, camera interface and audio controller. In a remote sensing device or appliance, the audio-visual components could be omitted and may be replaced with analog-to-digital controllers, for example.

The apparatus 200 may include a variety of processing engines, such as central processing units (CPUs) with multiple cores, graphical processing units (GPUs), digital signal processors (DSPs), neural processing units (NPUs), wireless transceiver units (also referred to as modems), peripherals, display and imaging interfaces, etc. Each of these subsystems and other functional elements can be implemented as an individual chiplet, or as a combination of chiplets. The chiplets included in the apparatus 200 can be proprietary or may be acquired from a variety of sources. An SoC may be constructed from chiplets manufactured at different process nodes and/or operated at different voltages.

Figure 3:
FIG. 3 illustrates an example of a system that employs a multi-channel data communication link.

FIG. 3 illustrates an example of an apparatus 300 in which certain components and interconnections are implemented in an SoC. The SoC may include or be coupled to a memory interface/bus 326 that can be adapted according to certain aspects of the present disclosure. The apparatus 300 may include a number of heterogeneous processors, such as a central processing unit (CPU) 302, a modem processor 304, a graphics processor 306, and an application processor 308. Each processor 302, 304, 306, 308, may include one or more cores, and each processor/core may perform operations independent of the other processors/cores. The processors 302, 304, 306, 308 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The apparatus 300 may include system components and resources 310 for managing sensor data, analog-to-digital conversions, and/or wireless data transmissions, and for performing other specialized operations (e.g., decoding high-definition video, video processing, etc.). System components and resources 310 may also include components such as voltage regulators, oscillators, phase-locked loops (PLLs), peripheral bridges, data controllers, system controllers, access ports, timers, and/or other similar components used to support the processors and software clients running on the computing device. The system components and resources 310 may also include circuitry for interfacing with peripheral devices, such as cameras, electronic displays, wireless communication devices, external memory chips, etc.

The apparatus 300 may further include a serial bus controller 312 such as a Universal Serial Bus (USB) controller, one or more memory controllers 314, and a centralized resource manager (CRM) 316. The apparatus 300 may also include an input/output module (not illustrated) for communicating with resources external to the SoC, each of which may be shared by two or more of the internal SoC components.

The processors 302, 304, 306, 308 may be interconnected to the serial bus controller 312, the memory controller 314, system components and resources 310, CRM 316, and/or other system components via an interconnection/bus module 322, which may include an array of reconfigurable logic gates and/or implement a bus architecture. Communications may also be provided by advanced interconnects, such as high-performance networks on chip (NoCs).

The interconnection/bus module 322 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 322 may implement an arbitration scheme to prevent multiple master components from attempting to drive the bus simultaneously. The memory controller 314 may be a specialized hardware module configured to manage the flow of data to and from a memory 324 via the memory interface/bus 326.

The memory controller 314 may comprise one or more processors configured to perform read and write operations with the memory 324. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 324 may be part of the apparatus 300.

The interconnection/bus module 322 in a chiplet-based system typically includes a serializer and deserializer per data lane. A conventional serializer may be implemented using cascaded flipflops and/or latches, which may be configured in a parallel in, serial out configuration. In one example, parallel data is loaded into a multibit shift register and then shifted through cascaded flipflops under the control of a clock signal. A data bit represented at the output of a first flipflop of the shift register may be shifted through a second flipflop when a transition in signaling state of the clock signal occurs. The output of the first flipflop is coupled to an input for the second flipflop and the input value of the second flipflop is captured as the output of the second flipflop when the transition in the clock signal occurs. Concurrently, the output of the first flipflop captures the input value of the first flipflop when the transition in the clock signal occurs. The number of cascaded flipflops may correspond to the number of bits in a data element to be serialized. The output of each flipflop may be coupled to the input of a next flipflop. In some instances, the input of the first flipflop in the cascade is coupled to a fixed voltage level and the output of the last flipflop in the cascade provides a serialized output data stream.

A conventional deserializer may be implemented using cascaded flipflops and/or latches, which may be configured in a serial in, parallel out configuration. In one example, a serial data stream is provided as an input to a multibit shift register that is implemented using cascaded flipflops. Data bits in the serial datastream are shifted through cascaded flipflops under the control of a clock signal. A data bit represented at the output of a first flipflop of the shift register may be shifted through a second flipflop when a transition in signaling state of the clock signal occurs. The output of the first flipflop is coupled to an input for the second flipflop and the input value of the second flipflop is captured as the output of the second flipflop when the transition in the clock signal occurs. Concurrently, the output of the first flipflop captures the input value of the first flipflop when the transition in the clock signal occurs. The number of cascaded flipflops may correspond to the number of bits in a serial datastream to be accumulated in a parallel data element. A parallel output of the deserializer may be obtained by sampling the outputs of the cascaded flipflops after occurrence of a number of shifts corresponding to the configured number of bits in an output data element. The number of shifts may be a function of the frequency of the clock signal.

In one example, the interconnection/bus module 322 may be expected to support at least one thousand data lanes, with corresponding numbers of serializers and deserializers in each chiplet coupled through the interconnection/bus module 322. Serializers and deserializers are frequently among the highest power consuming components in the system. Conventional serializers and deserializers include 40 to 80 high-speed flipflops that may be clocked at data rates up to 17 gigabits per second (Gbps) or more. CMOS logic can be used when lower clock rates are specified (e.g., clock rates that are less than 16 Gbps), while current mode logic may be used for higher clock rates (e.g., clock rates that are greater than 16 Gbps). Both CMOS logic circuits and current mode logic circuits are generally power-inefficient options.

Figure 4:
FIG. 4 illustrates an example of a data communication link that may be adapted or configured in accordance with certain aspects of this disclosure.

FIG. 4 illustrates an example of a data communication link 430 used to couple a modem 400 with a wireless transceiver 440. The modem 400 and wireless transceiver 440 may be collocated within a single IC device. The modem 400 and wireless transceiver 440 may be provided in an SoC. The modem 400 and wireless transceiver 440 may be resident on different chiplets. The modem 400 and wireless transceiver 440 may be located in different IC devices.

The data communication link 430 may include multiple data channels, which in some examples may be configured as a parallel bus. In the illustrated example, the data communication link 430 includes a data channel 432 and a clock channel 434 that each provide a transmission medium through which signals propagate between devices. In the illustrated example, a modem 400 transmits data in a first signal over the data channel 432 to a wireless transceiver 440 in accordance with timing information provided by a transmitter signal 418. The transmitter signal 418 may be generated by a clock generation circuit 406. The clock generation circuit 406 may include a phase locked loop, a delay locked loop, a phase shifting circuit, a phase interpolator or the like. The clock generation circuit 406 may generate the transmitter signal 418 using a base clock signal or system clock signal 416. The clock generation circuit 406 may provide a version of the transmitter signal 418 to be transmitted over the clock channel 434 as the bus clock signal 420. A driver circuit 408 may be configured to drive the bus clock signal 420 over the clock channel 434.

The modem 400 may include a serializer 402 configured to convert n-bit parallel data 410 into a serial data stream 412 for transmission in a transmit data signal 414 over the data channel 432. The transmit data signal 414 may be preconditioned by a pre-equalizing circuit, such as a digital feed-forward equalizer in order to combat or compensate for signal distortions attributable to inter-symbol interference (ISI), reflection and other effects that can be expected to limit bandwidth in the data channel 432. A driver circuit 404 that is configured to drive the data channel 432 may include the pre-equalizing circuit.

The wireless transceiver 440 can be configured to process a data signal 452 received over the data channel 432. The received data signal 452 may be provided to a receiver circuit 442. In some implementations, the receiver circuit 442 includes or cooperates with an equalizing circuit. In one example, continuous time linear equalization (CTLE) may be used to compensate for certain losses experienced in the data channel 432. The data channel 432 may be characterized in some respects as a low-pass filter. In the illustrated example, the receiver circuit 442 provides an equalized data signal 454 to a delay circuit 456. In one example, the delay circuit 456 is implemented using D-flipflops. In another example, the delay circuit 456 is implemented using a delay line constructed from inverters or buffers. The delay circuit 456 and/or a corresponding delay circuit 450 in the clock channel 434 may be configured to optimize timing associated with sampling data in the equalized data signal 454. For example, data may be sampled based on timing of edges in a sampling clock signal 462 derived from a bus clock signal 460 that is received over the clock channel 434. The output of the delay circuit 456 may be provided to a deserializer 446 that is clocked by the sampling clock signal 462. The deserializer 446 provides parallel output data 458.

In the illustrated wireless transceiver 440, the sampling clock signal 462 is derived using a delay circuit 450 that can be configured to position edges in the sampling clock signal 462 at optimal sampling points with respect to the equalized data signal 454. In some instances, a receiving circuit 448 coupled to the clock channel 434 may be configured to equalize the received bus clock signal 460. In some instances, a duty cycle correction circuit may be used to adjust the duty cycle of the sampling clock signal 462.

Limiting power consumption presents a major challenge in communication interfaces, including communication interfaces that include a SERDES physical layer (PHY) circuit. In mobile communication devices, reducing power consumption can increase battery life between charges. Accordingly, power consumption is a parameter that must be considered when PHY circuits are designed for communication interfaces that are required to meet ever-increasing demands for data rates and corresponding signaling rates associated with the communication interface. Demands for higher data rates and increased performance from SERDES-based PHY circuits are a consequence of continual advances in process technology and changing industry and proprietary standards. Moreover, PHY circuits are typically required to maintain backward compatibility to all previous generations of technology while supporting the higher data rates required by ever-evolving standards, necessitating increased numbers of transistors. The switching frequency of PHY circuits in communication interfaces can be a major factor in power consumption of an apparatus. For example, the operating frequencies of clock generation circuits for SERDES-based PHY circuits are determinative of maximum data rates for an application and power consumption increases as operating frequencies increase. In many implementations, it is desirable to use design an interface to handle clock signal that has a variable frequency. Different discrete clock frequencies, which may be referred to as "speed gears", may be defined for different modes of operation of a communication interface or system. For example, a high-speed mode, a low-power mode and one or more intermediate modes may be defined for a communication interface in a battery-powered device.

Typically, the data communication link 430 has a serializer 402 and a deserializer 446 for each data channel and many communication links may be used to interconnect chiplets in an SoC. Serializers and deserializers are typically among the highest power consuming circuits in the SoC. In aggregate, many thousands of serializers and deserializers may be assigned for data communication links in the SoC.

Figure 5:
FIG. 5 illustrates an example of a serializer and an example of a deserializer 520 that can be adapted or configured in accordance with certain aspects of this disclosure.
Figure 5:

FIG. 5 includes examples of a serializer 500 and a deserializer 520 that can be adapted or configured in accordance with certain aspects of this disclosure. The illustrated serializer 500 includes eight flipflops $502_0$-$502_7$ that are coupled in series. Each of the flipflops $502_0$-$502_7$ has an input (i.e., the 'D input') and an output (i.e., the 'Q output'). The flipflops $502_0$-$502_7$ receive a clock signal 504 at an edge-sensitive input. At each configured edge in the clock signal 504, each of the flipflops $502_0$-$502_7$ captures the signaling state at its D input and propagates the captured signaling state to its Q output. In the illustrated example, edges in the clock signal 504 cause data stored in the flipflops $502_0$-$502_7$ to propagate toward the serial output 508, which corresponds to a rightward direction in FIG. 5. The serializer 500 may be preloaded with a parallel data input 506. A parallel input provided to the serializer 500 may be captured using a load control signal (not shown). The bits of the parallel data input 506 are captured by a respective flipflops $502_0$-$502_7$ and propagated to corresponding Q outputs. After loading the bits captured by the flipflops $502_0$-$502_7$ can be propagate toward the serial output 508 under the control of the clock signal 504. The format of the parallel data input 506 and the direction of shifting through the serializer may be defined by standards, protocols, or by an application. The size of the parallel data input 506, measured as a number of bits, is configured based on the number of flipflops $502_0$-$502_7$ in the serializer 500.

The illustrated deserializer 520 includes eight flipflops $522_0$-$522_7$ that are coupled in series. Each of the flipflops $522_0$-$522_7$ has an input (i.e., the 'D input') and an output (i.e., the 'Q output'). The flipflops $522_0$-$522_7$ receive a clock signal 524 at an edge-sensitive input. At each configured edge in the clock signal 524, each of the flipflops $522_0$-$522_7$ captures the signaling state at its D input and propagates the captured signaling state to its Q output. In the illustrated example, edges in the clock signal 524 cause data stored in the flipflops $522_0$-$522_7$ to propagate toward the serial output 530, which corresponds to a rightward direction in FIG. 5. The deserializer 520 receives a serial data stream through its serial input 528. After a sufficient of clock cycles, parallel data may be captured from the Q outputs of the flipflops $522_0$-$522_7$. The parallel data may be transmitted through a parallel output 526 to be captured by external circuits. The format of the parallel data may be defined by standards, protocols, or by an application. The size of the parallel data, measured as a number of bits, is configured based on the number of flipflops $522_0$-$522_7$ in the deserializer 520.

Conventional serializers and deserializers are constructed using static flipflops. In one example, a static flipflop may be set or reset based on state of an input during a triggering transition between states of a clock signal received by the flipflop, where the transition may be a rising transition, a falling transition or any transition. In another example, a static flipflop may be set or reset based on state of an input when a clock signal is in an enabling signaling state (i.e., high state or low state). Active feedback circuits in the static flipflop can hold the output state of the flipflop between triggering transitions in the clock signal, or when the clock signal is not in the enabling signaling state.

Figure 6:
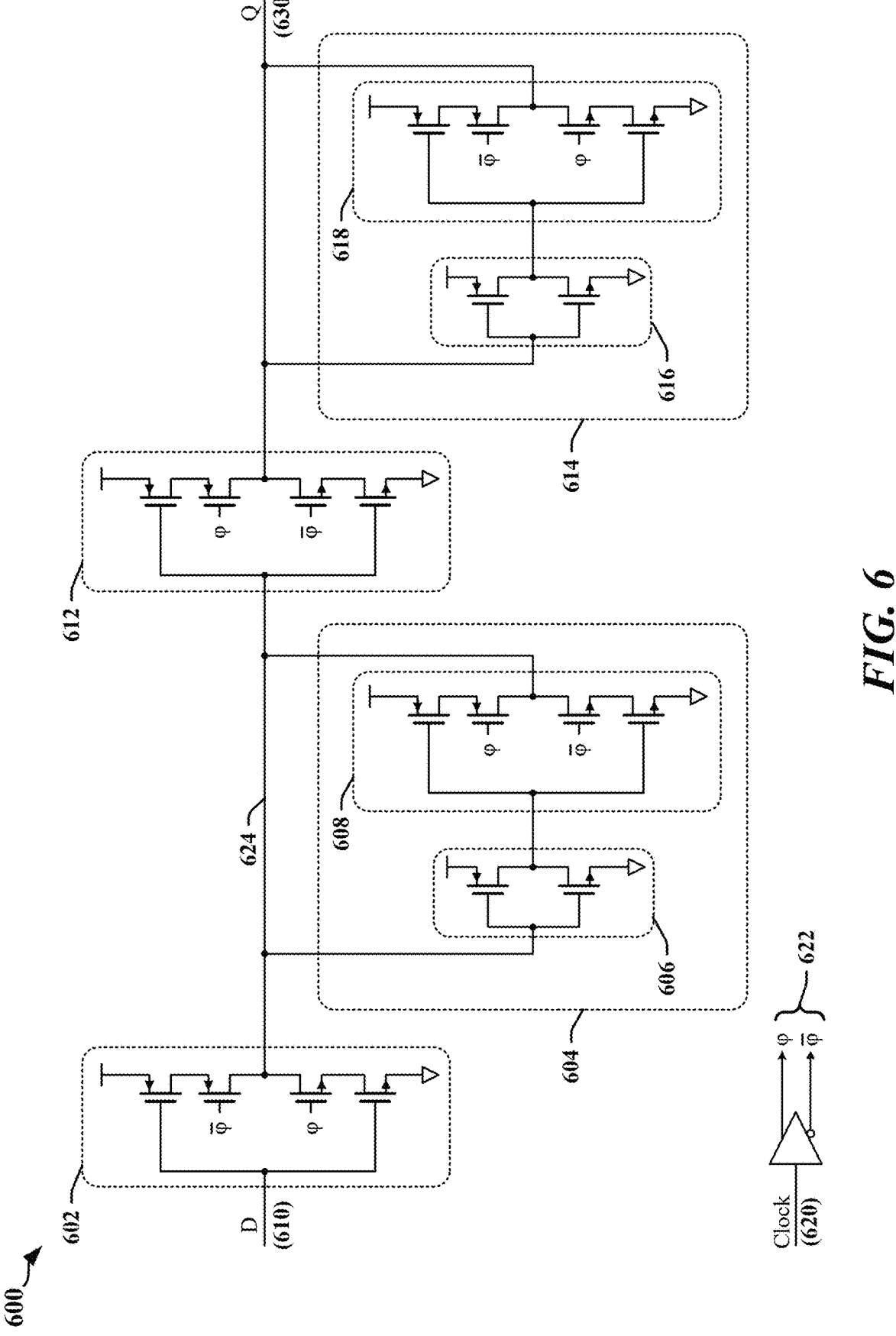
FIG. 6 illustrates an example of a static flipflop that may be adapted or configured in accordance with certain aspects of this disclosure.

FIG. 6 illustrates an example of a conventional static flipflop 600. The static flipflop 600 is configured to capture the signaling state of a data signal 610 at transitions of a clock signal 620. The output of the static flipflop 600 is maintained using active feedback, whereby at least one active transistor drives the output of the static flipflop 600 while the static flipflop 600 is powered or operational. A first stage of the static flipflop 600 includes a first gating circuit 602 that is configured to receive the data signal 610 and to output an inverted version of the data signal 610 when enabled by control signals 622 derived from the clock signal 620. In the illustrated example, the control signals 622 are complementary versions of the clock signal 620. For the purposes of this disclosure, complementary signals may be referred to as a differential signal that comprises a complementary pair of signals that are phase-shifted by 180° with respect to one another. The clock signal 620 switches between a higher voltage state (the "high signaling state") and a lower voltage state (the "low signaling state"). In the illustrated example, the first gating circuit 602 is enabled when the clock signal 620 is in the high signaling state and disabled when the clock signal 620 is in the low signaling state. The output of the first gating circuit 602 presents a high impedance when the first gating circuit 602 is disabled. The output of the first gating circuit 602 drives a first stage output signal 624 when the first gating circuit 602 is enabled.

The first stage output signal 624 is coupled to both the input and the output of a first feedback circuit 604 that is configured to maintain the signaling state of the first stage output signal 624 when the first gating circuit 602 is disabled. The first feedback circuit 604 includes at least one transistor that is configured to actively drive the first stage output signal 624 when the first gating circuit 602 is disabled. An input of a first inverter circuit 606 in the first feedback circuit 604 is coupled to the first stage output signal 624 and is configured to provide an inverted version of the first stage output signal 624 to the input of a second gating circuit 608.

The second gating circuit 608 is configured to drive the first stage output signal 624 when enabled and to present a high impedance when the second gating circuit 608 is disabled. The second gating circuit 608 is configured to output a non-inverted version of the first stage output signal 624 when enabled by the control signals 622. In the illustrated example, the second gating circuit 608 is enabled when the clock signal 620 is in the low signaling state and disabled when the clock signal 620 is in the high signaling state. That is, the second gating circuit 608 is enabled when the first gating circuit 602 is disabled and the first gating circuit 602 is enabled when the second gating circuit 608 is disabled. The second gating circuit 608 is configured to retain the signaling state of the output of the first gating circuit 602 at the transition between the high signaling state and the low signaling state of the clock signal 620. The output of the second gating circuit 608 remains unresponsive to changes in the signaling state of the data signal 610 while the first gating circuit 602 is disabled. The first stage output signal 624 changes in response to changes in signaling state of the data signal 610 when the first gating circuit 602 is enabled. A second stage of the static flipflop 600 includes a third gating circuit 612 that is configured to receive the first stage output signal 624 and to provide a non-inverted version of the data signal 610 as an output of the static flipflop 600 (the Q signal 630), when enabled by the control signals 622 derived from the clock signal 620. In the illustrated example, the third gating circuit 612 is enabled when the clock signal 620 is in the low signaling state and disabled when the clock signal 620 is in the high signaling state. The output of the third gating circuit 612 presents a high impedance when the third gating circuit 612 is disabled. The output of the third gating circuit 612 drives the Q signal 630 when the third gating circuit 612 is enabled. The third gating circuit 612 is enabled when the first gating circuit 602 is disabled and disabled when the first gating circuit 602 is enabled. The input to the third gating circuit 612 is driven by the second gating circuit 608 when the third gating circuit 612 is enabled.

The Q signal 630 is coupled to both the input and the output of a second feedback circuit 614 that is configured to maintain the signaling state of the Q signal 630 when the third gating circuit 612 is disabled. The second feedback circuit 614 includes at least one transistor that is configured to actively drive the Q signal 630 when the third gating circuit 612 is disabled. An input of a second inverter circuit 616 in the second feedback circuit 614 is coupled to the Q signal 630 and is configured to provide an inverted version of the Q signal 630 to the input of a fourth gating circuit 618.

The fourth gating circuit 618 is configured to drive the Q signal 630 when enabled and to present a high impedance when the fourth gating circuit 618 is disabled. The fourth gating circuit 618 is configured to output a non-inverted version of the Q signal 630 when enabled by the control signals 622. In the illustrated example, the fourth gating circuit 618 is enabled when the clock signal 620 is in the high signaling state and disabled when the clock signal 620 is in the low signaling state. That is, the fourth gating circuit 618 is enabled when the third gating circuit 612 is disabled. The third gating circuit 612 is enabled when the fourth gating circuit 618 is disabled. The fourth gating circuit 618 is configured to drive the Q signal 630 when enabled.

The illustrated static flipflop 600 may be adapted or modified to respond to either rising or falling edges of the clock signal 620. Flipflops are a fundamental building block of conventional serializers and deserializers. Such serializers and deserializers can consume a major portion of the power budget allocated for SoCs. While static flipflops can hold data indefinitely, switching speed can limit the maximum data rate supported in many applications. In mobile communication devices, the increased power consumption associated with higher switching frequencies can require a tradeoff between maximum data rate and battery life.

Figure 7:
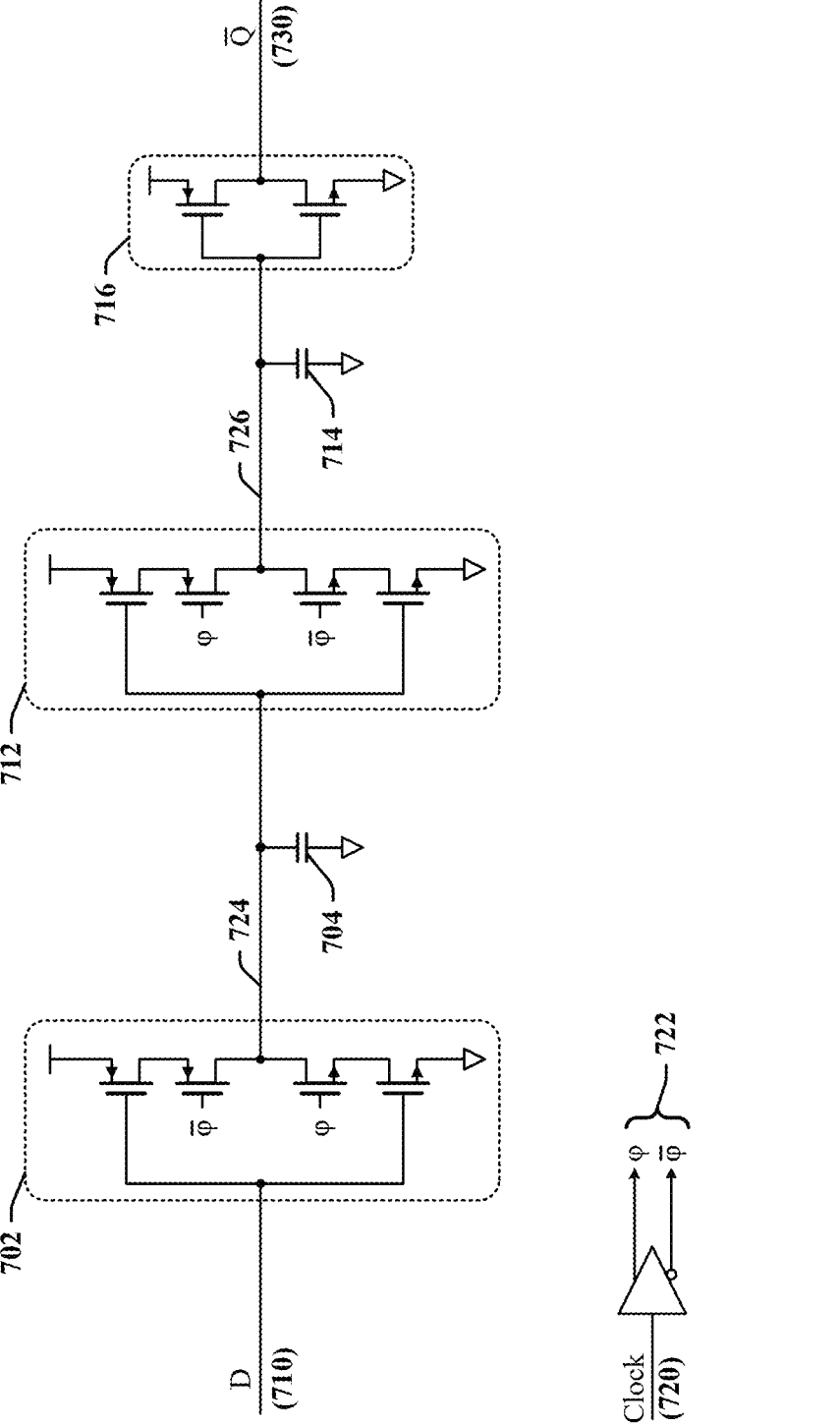
FIG. 7 illustrates an example of a dynamic flipflop that may be adapted or configured in accordance with certain aspects of this disclosure.

Dynamic flipflops can reduce power consumption and increase available data rates for SERDES circuits when used in certain high-speed applications. Feedback circuits are typically not included in dynamic flipflops, which rely on parasitic capacitances and/or added capacitance to hold the data. Dynamic flipflops can be manufactured using less area of an IC device and the reduced circuit complexity can enable dynamic flipflops to support higher data rates with reduced power consumption with respect to static flipflops. FIG. 7 illustrates an example of a dynamic flipflop 700. The dynamic flipflop 700 is configured to capture and the state of a data signal 710 at transitions of a clock signal 720. The output of the dynamic flipflop 700 is maintained due to the capacitively stored charge during at least some portion of the cycle of the clock signal 720. The capacitance may be attributable to parasitic capacitance measurable at the gate of an input transistor and, in some instances, may include an added capacitor. The charge is expected to decay over and the output of the dynamic flipflop 700 is maintained for a limited time. A first stage of the dynamic flipflop 700 includes a first gating circuit 702 that is configured to receive the data signal 710 and to output an inverted version of the data signal 710 when enabled by control signals 722 derived from the clock signal 720. In the illustrated example, the control signals 722 are complementary versions of the clock signal 720. The clock signal 720 switches between a high signaling state and a low signaling state. In the illustrated example, the first gating circuit 702 is enabled when the clock signal 720 is in the high signaling state and disabled when the clock signal 720 is in the low signaling state. The output of the first gating circuit 702 presents a high impedance when the first gating circuit 702 is disabled. The output of the first gating circuit 702 drives a first stage output signal 724 when the first gating circuit 702 is enabled. The first stage output signal 724 is coupled to a second gating circuit 712.

The signaling state of the first stage output signal 724 is maintained by parasitic capacitance and/or additional capacitive elements when the first gating circuit 702 is disabled. The combination of parasitic capacitance and additional capacitive elements is represented by the capacitor 704 in FIG. 7. In many implementations, the dynamic flipflop 700 relies on parasitic capacitance and operates without added capacitive elements. The source of the parasitic capacitance may include the interconnects that carry the first stage output signal 724, the drains of transistors in the first gating circuit 702 and the gates of transistors in second gating circuit 712. In some implementations, the parasitic capacitance may be sufficient to maintain the signaling state of the first stage output signal 724 for a half cycle of the clock signal 720 when the clock signal 720 switches at frequencies that exceed 1 GHz. In some implementations, parasitic capacitance is sufficiently large to reliably maintain the signaling state of the first stage output signal 724 for a half cycle of the clock signal 720 when the clock signal 720 switches at frequencies that are less than 1 GHz. In some implementations, additional capacitive elements are implemented to supplement the parasitic capacitance and thereby enable the signaling state of the first stage output signal 724 to be maintained for a half cycle of the clock signal 720 when the clock signal 720 switches at a desired or specified frequency that is less than 1 GHz.

A second stage of the dynamic flipflop 700 includes the second gating circuit 712. The second gating circuit 712 receives the first stage output signal 724 and outputs a non-inverted version of the data signal 710 (the second stage output signal 726) when enabled by the control signals 722 derived from the clock signal 720. In the illustrated example, the second gating circuit 712 is enabled when the clock signal 720 is in the low signaling state and disabled when the clock signal 720 is in the high signaling state. The output of the second gating circuit 712 presents a high impedance when the second gating circuit 712 is disabled. The output of the second gating circuit 712 drives the second stage output signal 726 when the second gating circuit 712 is enabled. The second gating circuit 712 is enabled when the first gating circuit 702 is disabled and disabled when the first gating circuit 702 is enabled. The signaling state at the input to the second gating circuit 712 can be maintained by the capacitor 704 when the second gating circuit 712 is disabled. The capacitor 704 represents parasitic capacitance, additional capacitive elements or some combination of parasitic capacitance and additional capacitive elements. The second stage output signal 726 is coupled to an inverter/driver circuit 716 that is configured to drive the output of the dynamic flipflop 700 (the Q' signal 730). The Q' signal 730 is nominally an inverted version of the data signal 710.

The signaling state of the second stage output signal 726 is maintained by parasitic capacitance and/or additional capacitive elements when the second gating circuit 712 is disabled. The combination of parasitic capacitance and additional capacitive elements is represented by the capacitor 714 in FIG. 7. In many implementations, the dynamic flipflop 700 relies on parasitic capacitance and operates without added or supplemental capacitive elements. The source of the parasitic capacitance may include the interconnects that carry the second stage output signal 726, the drains of transistors in the second gating circuit 712 and the gates of transistors in the inverter/driver circuit 716. In some implementations, the parasitic capacitance may be sufficient to maintain the signaling state of the second stage output signal 726 for a half cycle of the clock signal 720 when the clock signal 720 switches at frequencies that exceed 1 GHz. In some implementations, parasitic capacitance is sufficiently large to reliably maintain the signaling state of the second stage output signal 726 for a half cycle of the clock signal 720 when the clock signal 720 switches at frequencies that are less than 1 GHz. In some implementations, additional capacitive elements can be provided to supplement the parasitic capacitance and thereby enable the signaling state of the second stage output signal 726 to be maintained for a half cycle of the clock signal 720 when the clock signal 720 switches at a desired or specified frequency that is less than 1 GHZ.

The illustrated dynamic flipflop 700 may be adapted or modified to respond to either rising or falling edges of the clock signal 720. The signaling state of the first stage output signal 724 and the second stage output signal 726 may change when the voltage across the corresponding capacitor 704 or 714 decays sufficiently. The voltage across the capacitors 704, 714 decays when the second gating circuit 712 is disabled, through device leakage. The effects of leakage increase with reduced clock frequency and can disrupt data storage in dynamic flipflops. The potential loss of data at lower frequencies can limit the use of dynamic flipflops in serializers and deserializers that receive clock signals with a scalable frequency.

Certain aspects of this disclosure relate to hybrid serializers and deserializers that can be used in high-speed bus interfaces, which may be implemented in accordance with proprietary or standards-based protocols, including protocols that are defined by UCIe, Peripheral Component Interconnect Express (PCIe), Universal Serial Bus (USB), Serial Advanced Technology Attachment (SATA) standards, among others. Certain aspects of this disclosure relate to hybrid serializers and deserializers that can be used in applications that require or anticipate a wide variability in clock frequency. Hybrid serializers and deserializers can be configured according to certain aspects of this disclosure to operate optimally in a range of clock frequencies extending from less than 1 GHz to greater than 5 GHz. In one example, a hybrid serializer or deserializer can operate when clocked by a signal that scales data rates between 40 megabits per second (40 Mbps) and 32 Gbps. Hybrid serializers and deserializers implemented in accordance with this disclosure may enable dynamic flipflop circuits at higher frequencies and may enable static flipflops at lower frequencies. The static flipflops can be configured to retain data when clocking is suppressed.

Figure 8:
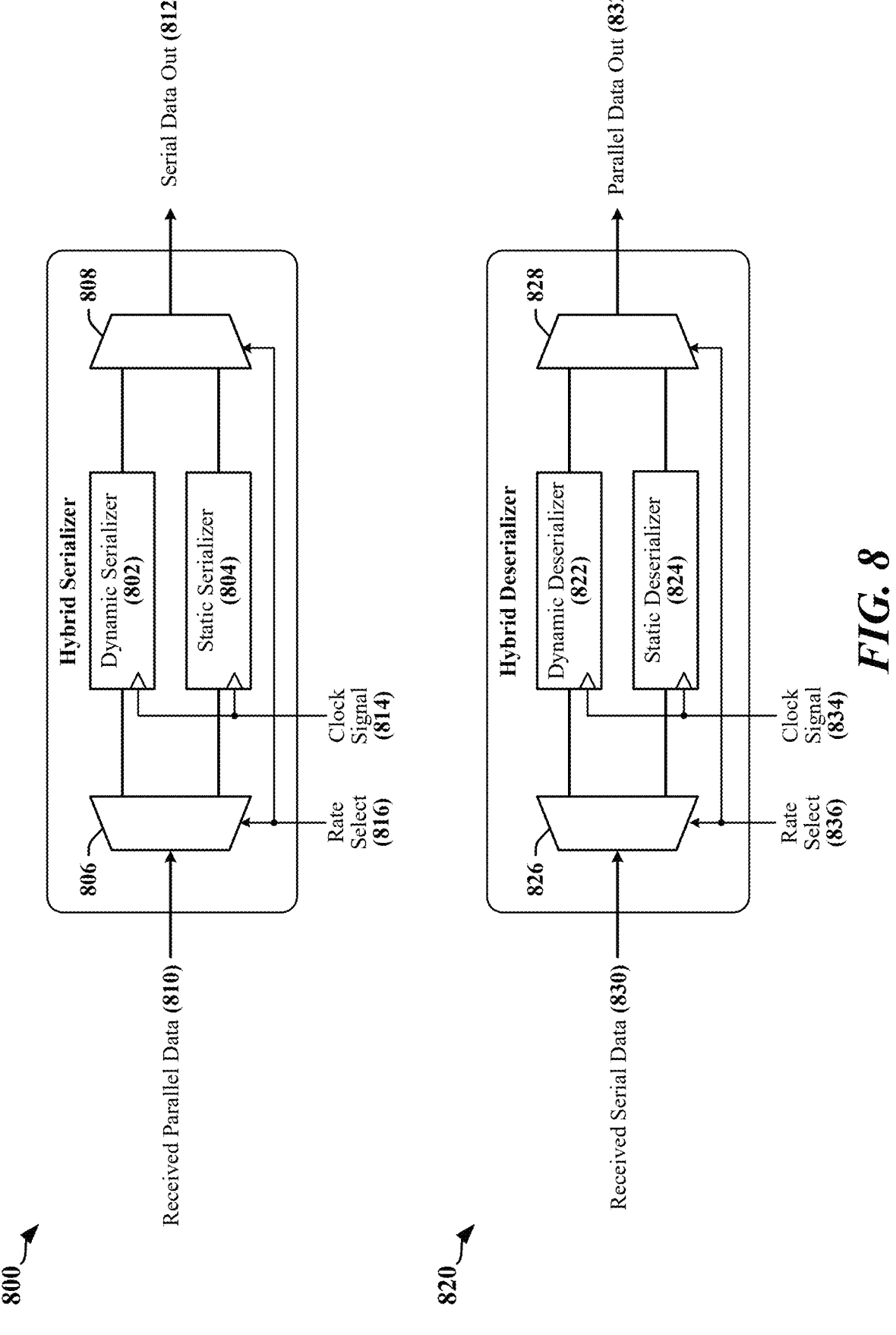
FIG. 8 illustrates an example of a hybrid serializer and a hybrid deserializer that may be implemented in accordance with certain aspects of this disclosure.

FIG. 8 provides schematic representations of a hybrid serializer 800 and a hybrid deserializer 820 that may be implemented in accordance with certain aspects of this disclosure. The hybrid serializer 800 is configured to convert received parallel data 810 to a serial data stream 812 under the control of a clock signal 814. The frequency of the clock signal 814 may vary over a broad range of frequencies. In some implementations, the frequency of the clock signal can vary between 40 MHz or less and 32 GHz or more.

The hybrid serializer 800 includes a dynamic serializer 802 and a static serializer 804. In one example, the dynamic serializer 802 has a circuit architecture that is consistent with the circuit architecture of the serializer 500 illustrated in FIG. 5, but configured for a desired size of the received parallel data 810. The flipflops of the dynamic serializer 802, which correspond to the flipflops $502_0$-$502_7$ of the serializer 500 illustrated in FIG. 5, may be implemented using the dynamic flipflop 700 illustrated in FIG. 7.

In another example, the static serializer 804 has a circuit architecture that is consistent with the circuit architecture of the serializer 500 illustrated in FIG. 5, but configured for a desired size of the received parallel data 810. The flipflops of the static serializer 804, which correspond to the flipflops $502_0$-$502_7$ of the serializer 500 illustrated in FIG. 5, may be implemented using the static flipflop 600 illustrated in FIG. 6.

A rate select signal 816 may be used to select a mode of operation for the hybrid serializer 800. In a first mode, the rate select signal 816 causes the dynamic serializer 802 to convert the parallel data 810 to the serial data stream 812. In a second mode, the rate select signal 816 causes a static serializer 804 to convert the parallel data 810 to the serial data stream 812. In one example, the hybrid serializer 800 can be configured to serialize 8-bit parallel data. In the latter example, 8-bit data bytes may be provided to the hybrid serializer 800 at a rate of 5 Mbps when the serial data stream 812 is output at 40 Mbps, and at a rate of 4 Gbps when the serial data stream 812 is output at 32 Gbps.

The signaling state of the rate select signal 816 may be configured based on the frequency of the clock signal 814. The rate select signal 816 may be configured for a first signaling state when the frequency of the clock signal 814 equals or exceeds a preconfigured threshold frequency, and may be configured for a second signaling state when the frequency of the clock signal 814 is less than the preconfigured threshold frequency. In one example, the preconfigured threshold frequency may be set to 1 GHZ. The preconfigured threshold frequency may be determined based on the process node associated with the integrated circuit in which the hybrid serializer 800 is implemented. The preconfigured threshold frequency may be determined based on the architecture or complexity of the circuits in the hybrid serializer 800. In some instances, the signaling state of the rate select signal 816 may be configured for the second mode when the clock signal 814 is suppressed.

The rate select signal 816 may be configured by a processing circuit or controller that manages the communication link that includes the hybrid serializer 800. In one example, an application may determine the data rate for a communication link and may provide a codeword that configures a clock generation circuit. In this example, the rate select signal 816 may be provided directly by a processing circuit or controller or may be generated based on the value of the codeword. In another example, the data rate for a communication link may be defined by a clock signal received over the communication link. In this example, the rate select signal 816 may be generated based on the value of a codeword used to configure a phase locked loop, delay locked loop or another component of a local clock generation circuit.

In the illustrated example, a demultiplexer circuit 806 is controlled by the rate select signal 816 and used to direct the parallel data 810 to the input of the dynamic serializer 802 or to the input of the static serializer 804 based on signaling state of the rate select signal 816. In one example, the demultiplexer circuit 806 includes a demultiplexing subcircuit for each bit of the parallel data 810. For the purposes of this disclosure, a demultiplexer may be implemented using combinational logic and configured to switch an input signal to a selected one of two or more outputs.

In the illustrated example, a multiplexer 808 is used to select between the outputs of the dynamic serializer 802 and the static serializer 804 to provide an output of the hybrid serializer 800. In the illustrated example, the multiplexer 808 is controlled by the rate select signal 816. For the purposes of this disclosure, a multiplexer may be implemented using combinational logic and can be configured to select an output from two or more input signals.

The hybrid deserializer 820 is configured to convert received serial data 830 to parallel data 832 under the control of a clock signal 834. The frequency of the clock signal 834 may vary over a broad range of frequencies. In some implementations, the frequency of the clock signal can vary between 40 Mbps or less and 32 Gbps or more.

The hybrid deserializer 820 includes a dynamic deserializer 822 and a static deserializer 824. In one example, the dynamic serializer 822 has a circuit architecture that is consistent with the circuit architecture of the deserializer 520 illustrated in FIG. 5, but configured for a desired size of the parallel data 832. The flipflops of the dynamic deserializer 822, which correspond to the flipflops $522_0$-$522_7$ of the deserializer 520 illustrated in FIG. 5, may be implemented using the dynamic flipflop 700 illustrated in FIG. 7.

In another example, the static deserializer 824 has a circuit architecture that is consistent with the circuit architecture of the deserializer 520 illustrated in FIG. 5, but configured for a desired size of the received parallel data 810. The flipflops of the static deserializer 824, which correspond to the flipflops $522_0$-$522_7$ of the deserializer 520 illustrated in FIG. 5, may be implemented using the static flipflop 600 illustrated in FIG. 6.

A rate select signal 836 may be used to select a mode of operation for the hybrid deserializer 820. In a first mode, the rate select signal 836 causes a dynamic deserializer 822 to convert the received serial data 830 to the parallel data 832. In a second mode, the rate select signal 836 causes a static deserializer 824 to convert the received serial data 830 to the parallel data 832. In one example, the hybrid deserializer 820 can be configured to output parallel data 832 in 8-bit bytes. In the latter example, 8-bit data bytes may be output by the hybrid deserializer 820 at a rate of 5 Mbps when the received serial data 830 is received at 40 Mbps, and at a rate of 4 Gbps when the received serial data 830 is received at 32 Gbps.

The signaling state of the rate select signal 836 may be configured based on the frequency of the clock signal 834. The rate select signal 836 may be configured for a first signaling state when the frequency of the clock signal 834 equals or exceeds a preconfigured threshold frequency, and may be configured for a second signaling state when the frequency of the clock signal 834 is less than the preconfigured threshold frequency. In one example, the preconfigured threshold frequency may be set to 1 GHZ. The preconfigured threshold frequency may be determined based on the process node associated with the integrated circuit in which the hybrid deserializer 820 is implemented. The preconfigured threshold frequency may be determined based on the architecture or complexity of the circuits in the hybrid deserializer 820. In some instances, the signaling state of the rate select signal 836 is configured for the second mode when the clock signal 834 is suppressed.

The rate select signal 836 may be configured by a processing circuit or controller that manages the communication link that includes the hybrid deserializer 820. In one example, an application may determine the data rate for a communication link and may provide a codeword that configures a local clock generation circuit. In this example, the rate select signal 836 may be provided directly by a processing circuit or controller or may be generated based on the value of the codeword. In another example, the data rate for a communication link may be defined by a clock signal received over the communication link. In this example, the rate select signal 836 may be generated based on the value of a codeword used to configure a phase locked loop, delay locked loop or another component of the local clock generation circuit.

In the illustrated example, a demultiplexer 826 is controlled by the rate select signal 836 and used to direct the received serial data 830 to the input of the dynamic deserializer 822 or to the input of the static deserializer 824 based on signaling state of the rate select signal 836. In the illustrated example, a multiplexer circuit 828 is controlled by the rate select signal 836 and used to select between the outputs of the dynamic deserializer 822 and the static deserializer 824 to provide an output of the hybrid deserializer 820. In one example, the multiplexer circuit 828 includes a multiplexing subcircuit for each bit of the parallel data 832.

According to certain aspects of this disclosure, the hybrid serializer 800 and hybrid deserializer 820 may be used to support systems that operate using different speed gears. In the context of the hybrid serializer 800 and hybrid deserializer 820, speed gears may be associated with some number of frequencies defined for the corresponding clock signal 814 and 834. A speed gear may be selected based on processing load, power consumption, remaining battery power, application requirements and other factors. In one example, multiple speed gears may be defined for clock frequencies that range between 40 Mbps or less and 32 Gbps or more. The rate select signal 816 or 836 may be configured based on the clock gear selection. For example, a finite number of speed gears may be defined and used to index a table of corresponding clock frequencies. In the latter example, the rate select signal 816 or 836 setting may be defined by an entry in the table or based on the index used to represent clock gear.

In certain implementations, use of the dynamic serializer 802 and the dynamic deserializer 822 may be identified with high-speed operation at higher frequencies. The use of the static serializer 804 and static deserializer 824 may be identified with low-power operation at lower frequencies. The clock signals provided to circuits involved in operation of the static serializer 804 and static deserializer 824 may be blocked during high-speed operation. Circuits involved in operation of the dynamic serializer 802 and the dynamic deserializer 822 may be powered down or provided reduced power during low-power operation.

Certain aspects of this disclosure relate to configurations of serializers and deserializers that can be operated at lower power than conventional serializers and deserializers. In certain implementations, dynamic and static flipflops in hybrid serializers and hybrid deserializers can be clocked at lower rates than in conventional serializers and deserializers and can provide significant reductions in associated power consumption. Power consumption can be reduced when certain serializer and deserializer circuits are operated in accordance with clock signals that have a frequency that is lower than the data rate of the serial data signal transmitted over a communication link. In one aspect of this disclosure, a chain of flipflops can be broken into smaller groups of flipflops that can be clocked at lower frequencies. For ease of description, certain examples of 16-bit serializer and deserializer circuits are proved herein, although the concepts disclosed herein are not confined to 16-bit data operations.

Figure 9:
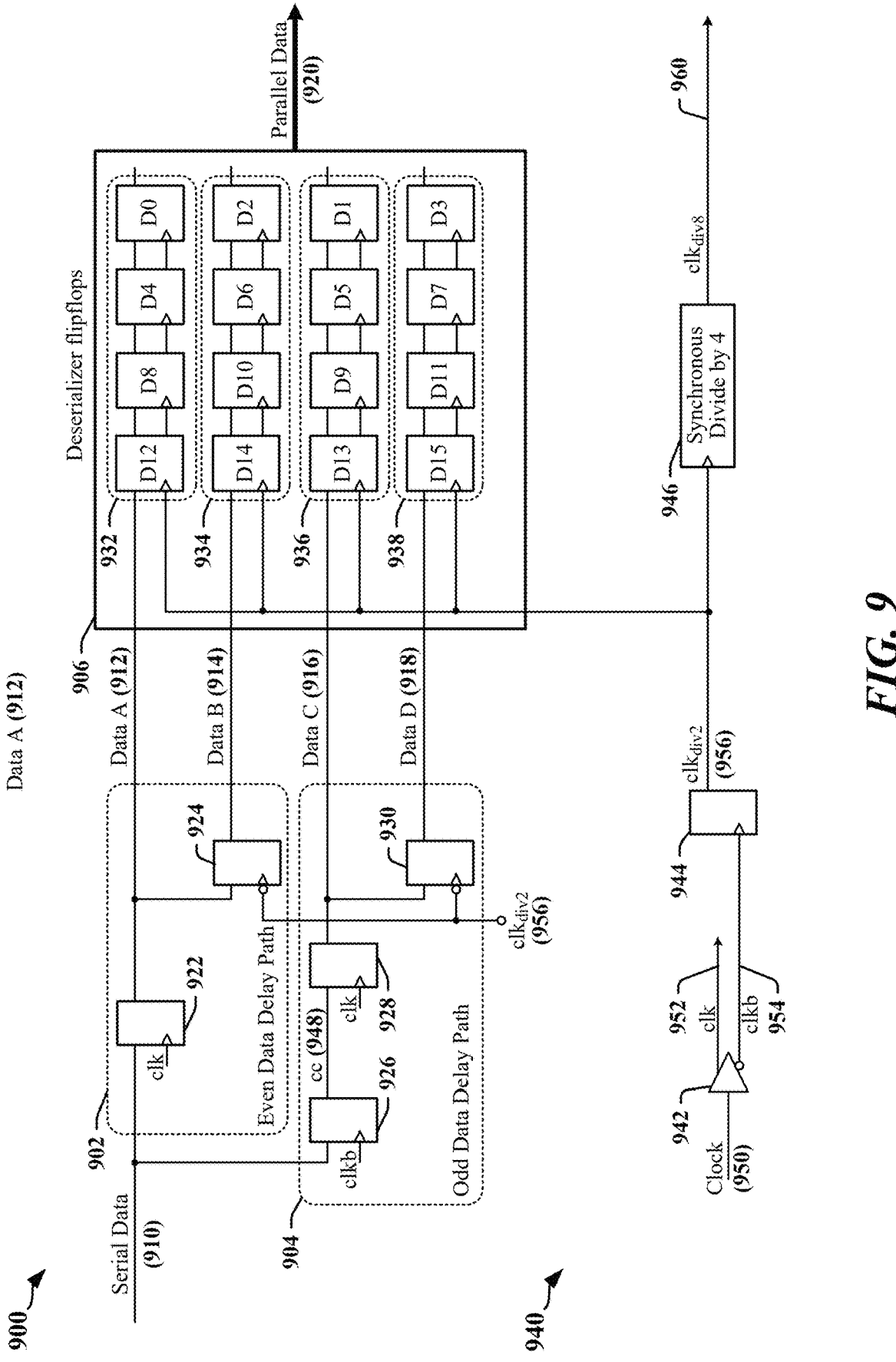
FIG. 9 illustrates a deserializer and an associated clock generation circuit that may be adapted or configured in accordance with certain aspects of this disclosure.
Figure 10:
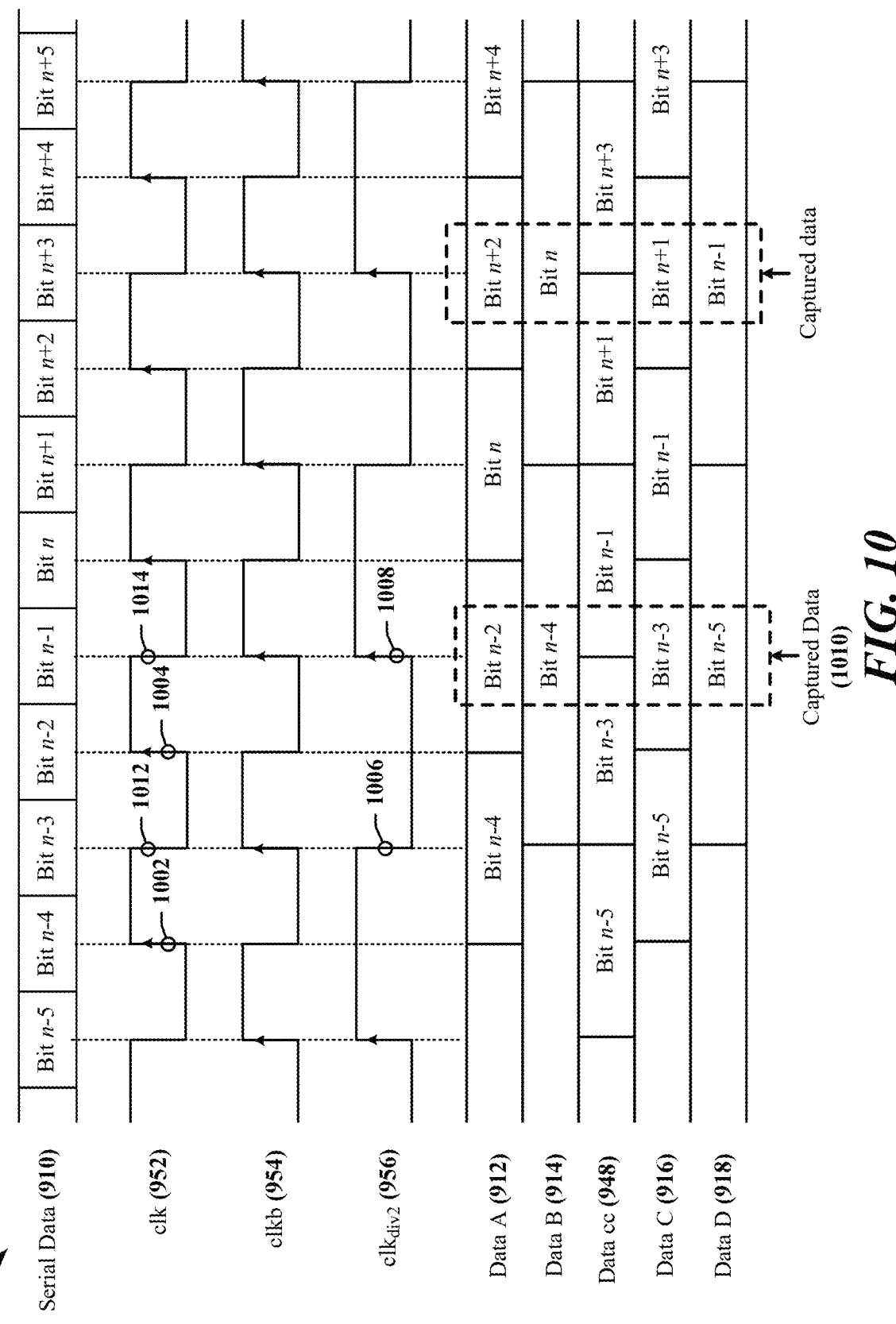
FIG. 10 includes a timing diagram that illustrates certain aspects of the operation of the deserializer and associated clock generation circuit illustrated in FIG. 9.

FIG. 9 includes schematic representations of a deserializer 900 and an associated clock generation circuit 940 that may be adapted or configured in accordance with certain aspects of this disclosure. FIG. 10 includes a timing diagram 1000 that illustrates certain aspects of the operation of the deserializer 900 and associated clock generation circuit 940.

The deserializer 900 may be implemented using some combination of dynamic flipflops 700 and static flipflops 600. The deserializer 900 is configured to convert serial data received in a serial data signal 910 to parallel data 920 in accordance with timing provided by a clock signal 950. The frequency of the clock signal 950 may vary over a broad range of frequencies. In some implementations, the frequency of the clock signal 950 can vary between 40 Mbps or less and 32 Gbps or more.

In the illustrated example, the clock signal 950 provided to the clock generation circuit 940 is a half-rate, phase shifted version of a transmit clock signal. The term "half-rate clock signal" as used herein refers to the use of a clock signal with a frequency that correspond to half the rate at which serial data in the serial data signal 910 is received. One bit of data is received in the serial data signal 910 in a bit transmission interval that has a duration that corresponds to a half cycle of the clock signal 950. The use of a half-rate clock signal can significantly reduce power consumption of the deserializer 900 with respect to conventional deserializers. The clock signal 950 is phase shifted with respect to the serial data signal 910. Accordingly, rising and falling edges in the clock signal 950 are expected to occur at the midpoint of bit transmission intervals in the serial data signal 910. The rising and falling edges in the clock signal 950 provide timing information that can be used to sample the serial data signal 910.

In the illustrated example, a driver circuit 942 receives the clock signal 950 and provides a differential version of the clock signal 950 that includes a pair of complementary signals (the clk signal 952 and the clkb signal 954). The clk signal 952 and the clkb signal 954 are phase shifted by a nominal 180° with respect to one another. In the illustrated example, the clkb signal 954 clocks a toggling flipflop 944 to provide a divided clock signal, which is referred to herein as the clk$_{div2}$ signal 956. The signaling state of the clk$_{div2}$ signal 956 changes once for clock cycle of the clkb signal 954. The signaling state of the clk$_{div2}$ signal 956 toggles at half the frequency of the clkb signal 954.

In the illustrated example, the signaling state of the clk$_{div2}$ signal 956 changes at the rising edges of the clkb signal 954. In the illustrated example, the clk$_{div2}$ signal 956 is provided to the clock input of a synchronous counter 946. The frequency of the clock signal (i.e., the clkdivs signal 960)

that is output by the synchronous counter 946 typically corresponds to the rate at which data is output by the deserializer 900, permitting external circuitry to reliably capture complete data words. In the illustrated example, the synchronous counter 946 is a divide-by-4 synchronous counter.

The illustrated deserializer 900 includes a 4×4 array of deserializer flipflops 906 configured to provide four 4-bit deserializing subcircuits 932, 934, 936, 938. Each of the deserializer flipflops 906 is clocked by the clk$_{div2}$ signal 956. The serial data signal 910 is delayed to obtain four delayed data signals, including the Data A signal 912, the Data B signal 914, the Data C signal 916 and the Data D signal 918. The delayed data signals are provided as inputs to corresponding 4-bit deserializing subcircuits 932, 934, 936, 938. In the illustrated example, an even data delay path 902 and an odd data delay path 904 are identified.

The even data delay path 902 is configured to generate the Data A signal 912 that is provided to a first 4-bit deserializing subcircuit 932, and to generate the Data B signal 914 that is provided to a second 4-bit deserializing subcircuit 934. For the purposes of this description, the data represented by the Data A signal 912 and the Data B signal 914 correspond to even bits of the data received in the serial data signal 910. The serial data signal 910 is provided to an input of a first even delay flipflop 922 that is clocked by the clk signal 952 and that outputs the Data A signal 912. The Data A signal 912 represents the signaling state of the serial data signal 910 at rising edges 1002, 1004 of the clk signal 952. The Data B signal 914 is obtained by delaying the Data A signal 912. The Data A signal 912 is provided to an input of a second even delay flipflop 924 that is clocked by the clk$_{div2}$ signal 956. The second even delay flipflop 924 outputs the Data B signal 914. The Data B signal 914 represents the signaling state of the Data A signal 912 at a falling edge 1006 in the clk$_{div2}$ signal 956. The signaling states of the Data A signal 912 and the Data B signal 914 are captured by corresponding 4-bit deserializing subcircuits 932, 934 at a point in time 1010 defined by a rising edge 1008 of the clk$_{div2}$ signal 956. As depicted in the illustrated example, a rising edge 1004 occurs in the clk signal 952 after the falling edge 1006 in the clk$_{div2}$ signal 956 and before the rising edge of the clk$_{div2}$ signal 956 at which the signaling states of the Data A signal 912 and the Data B signal 914 are captured. Accordingly, the Data A signal 912 and the Data B signal 914 represent consecutively transmitted even data bits (Bit n−2 and Bit n−4) when captured at a predefined point in time 1010.

The odd data delay path 904 is configured to generate the Data C signal 916 that is provided to a third 4-bit deserializing subcircuit 936, and to generate the Data D signal 918 that is provided to a second 4-bit deserializing subcircuit 938. For the purposes of this description, the data represented by the Data C signal 916 and the Data D signal 918 correspond to the odd bits of the data received in the serial data signal 910. The serial data signal 910 is provided to an input of a first odd delay flipflop 926 that is clocked by the clkb signal 954 and that outputs an intermediate data signal (the cc signal 948). The cc signal 948 represents the signaling state of the serial data signal 910 at falling edges 1012, 1014 of the clk signal 952. The cc signal 948 is provided to an input of a second odd delay flipflop 928 that is clocked by the clk signal 952 and that outputs the Data C signal 916. Accordingly, the Data A signal 912 and the Data C signal 916 represent consecutively transmitted data bits (e.g., Bit n−2 and Bit n−3) when captured by corresponding 4-bit deserializing subcircuits 932, 936.

The Data D signal 918 is obtained by delaying the Data C signal 916. The Data C signal 916 is provided to an input of a third odd delay flipflop 930 that is clocked by the clk$_{div2}$ signal 956. The third odd delay flipflop 930 outputs the Data D signal 918. The Data D signal 918 represents the signaling state of the Data C signal 916 at a falling edge 1006 in the clk$_{div2}$ signal 956. The signaling states of the Data C signal 916 and the Data D signal 918 are captured by corresponding 4-bit deserializing subcircuits 936, 938 at the rising edge of the clk$_{div2}$ signal 956. As depicted in the illustrated example, a rising edge 1004 occurs in the clk signal 952 after the falling edge 1006 in the clk$_{div2}$ signal 956 and before the rising edge of the clk$_{div2}$ signal 956 at which the signaling states of the Data C signal 916 and the Data D signal 918 are captured. Accordingly, the Data C signal 916 and the Data D signal 918 represent consecutively transmitted odd data bits (e.g., Bit n–3 and Bit n–5) when captured at the predefined point in time 1010.

In the illustrated example, the first 4-bit deserializing subcircuit 932 is configured to capture the {D0, D4, D8, D12} set of even bits, the second 4-bit deserializing subcircuit 934 is configured to capture the {D2, D6, D10, D14} set of even bits, the third 4-bit deserializing subcircuit 936 is configured to capture the {D1, D5, D9, D11} set of odd bits, and the fourth 4-bit deserializing subcircuit 938 is configured to capture the {D3, D7, D113, D15} set of odd bits. In certain implementations an external circuit may be configured to use the timing provided in the clk$_{div5}$ signal 960 to capture a 16-bit word (D0-D15) from the outputs of the deserializer flipflops 906.

Figure 11:
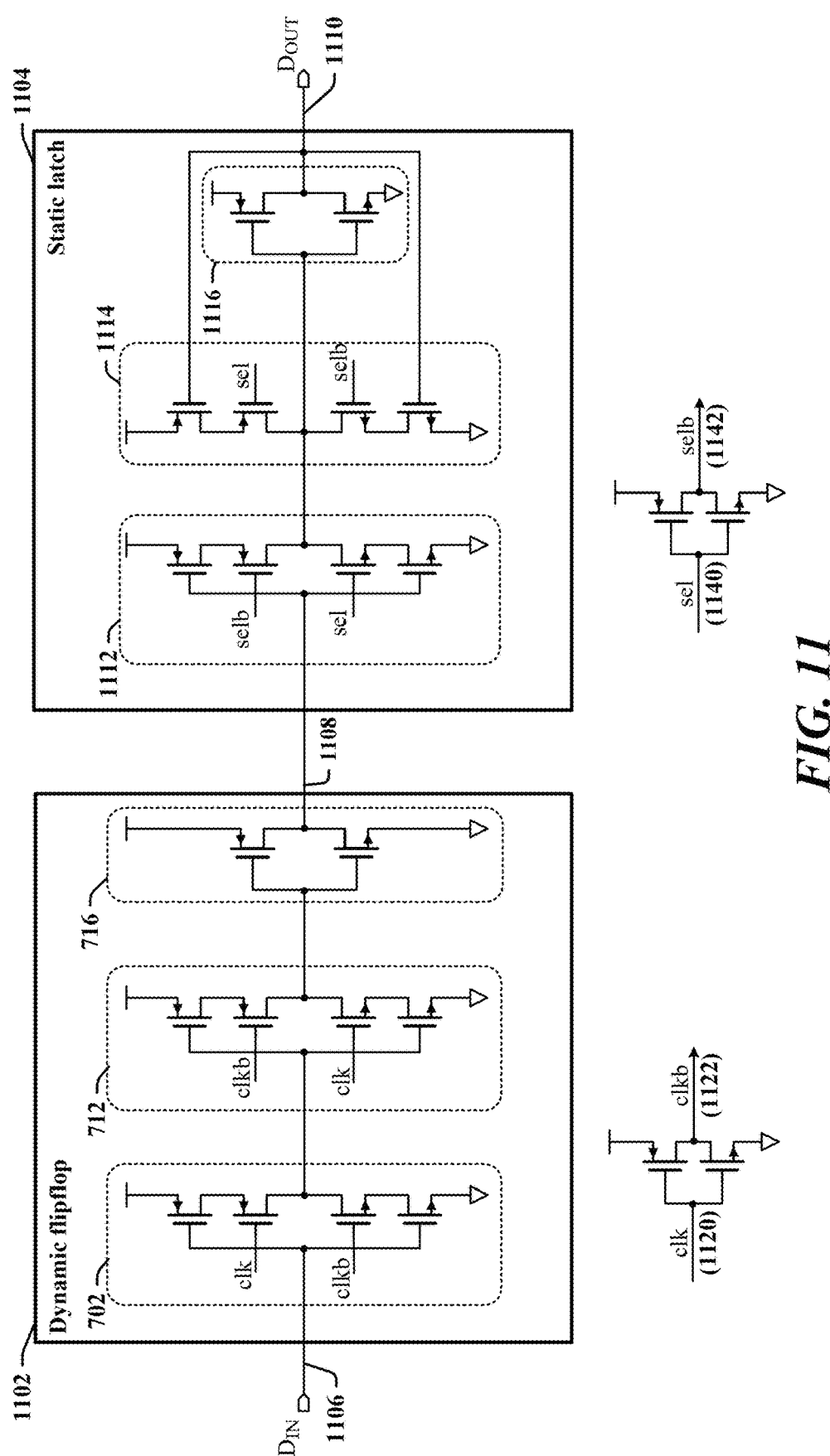
FIG. 11 illustrates an example of a hybrid flipflop in accordance with certain aspects of this disclosure.

FIG. 11 illustrates an example of a hybrid flipflop 1100 that may be implemented in accordance with certain aspects of this disclosure. The hybrid flipflop 1100 may be used to implement one or more of the deserializer flipflops 906 in the deserializer 900 illustrated in FIG. 9. The illustrated hybrid flipflop 1100 includes a first stage 1102 that includes elements of a dynamic flipflop, and a second stage 1104 that includes elements of a static flipflop. In the illustrated example, the first stage 1102 comprises a dynamic flipflop such as the dynamic flipflop 700 illustrated in FIG. 7 and the second stage 1104 comprises a static latch, which may be implemented using a reconfigured or adapted second stage of the static flipflop 600 illustrated in FIG. 6.

The dynamic flipflop of the first stage 1102 is controlled by a clock signal (the clk signal 1120) and an inverse clock signal (the clkb signal 1122), generally in the manner described for the dynamic flipflop 700 illustrated in FIG. 7. The static latch of the second stage 1104 includes a first gating circuit 1112 and a second gating circuit 1114 that are controlled using a gate control signal 1140 and an inverse gate control signal 1142. The gate control signal 1140 and inverse gate control signal 1142 signal are coupled to the gating circuits 1112, 1114 such that a maximum of one of the gating circuits 1112, 1114 is enabled at any time. The first gating circuit 1112 is enabled when the gate control signal 1140 is in a first signaling state and disabled when the gate control signal 1140 is in a second signaling state. The second gating circuit 1114 is disabled when the gate control signal 1140 is in the first signaling state and enabled when the gate control signal 1140 is in the second signaling state.

An input signal (D$_{IN}$ 1106) may be clocked through the first stage 1102. The output 1108 of the first stage 1102 is coupled to the input of the first gating circuit 1112 of the second stage 1104. When the first gating circuit 1112 is enabled, the output 1108 of the first stage 1102 is propagated to the output 1110 of the hybrid flipflop 1100. The output 1110 of the hybrid flipflop 1100 is driven by an inverter/ driver circuit 1116. When the first gating circuit 1112 is disabled, the second gating circuit 1114 of the second stage 1104 actively feeds back the signaling state of the output 1110 of the hybrid flipflop 1100 to the input of the inverter/driver circuit 1116, thereby latching the output 1110 of the hybrid flipflop 1100.

FIG. 12 is a flowchart 1200 of a method for configuring a data conversion circuit in accordance with certain aspects of this disclosure. The method may be performed using any of serializers or deserializers disclosed herein. In some instances, the method may be implemented by, or may involve one or more processors or controllers, including the processor 206 and/or application processor 208 in the SoC 200 illustrated in FIG. 2, or the CPU 302, any of the processors 304, 306, 308, any of the controllers 312, 314 or other components 316, 310 in the apparatus 300 illustrated in FIG. 3.

At block 1202 in the illustrated method, a mode of operation for the data conversion circuit is selected based on the frequency of a clock signal that controls a rate at which data is to be shifted through the data conversion circuit. At block 1204 in the illustrated method, first cascaded flipflops are enabled to convert first data to second data in a first mode of operation. The first cascaded flipflops may include a plurality of series-coupled dynamic flipflops. Each dynamic flipflop may be configured to retain signaling state of its output based on passive feedback or data retention. In one example, a dynamic flipflop is configured to retain signaling state of its output based on a capacitance at its input. The capacitance may be parasitic. In some instances, a capacitive device may be added to the input of a dynamic flipflop. At block 1206 in the illustrated method, a first selection circuit is configured to select an output of the first cascaded flipflops as an output of the data conversion circuit in the first mode of operation. The first selection circuit may include a multiplexer.

At block 1208 in the illustrated method, second cascaded flipflops may be enabled to convert the first data to the second data in a second mode of operation. The second cascaded flipflops may include a plurality of series-coupled static flipflops. Each static flipflop may be configured to retain signaling state of its output through a feedback circuit that actively drives its input. At block 1210 in the illustrated method, the first selection circuit may be configured to select an output of the second cascaded flipflops as the output of the data conversion circuit in the second mode of operation.

In some implementations, a second selection circuit is configured to provide the first data to an input of the first cascaded flipflops when the data conversion circuit is operated in the first mode of operation. The second selection circuit may be configured to provide the first data to an input of the second cascaded flipflops when the data conversion circuit is operated in the second mode of operation.

In some implementations, each of the first cascaded flipflops has a dynamic flipflop portion that is series-coupled to a static flipflop portion. The capacitance at the input of each dynamic flipflop may include a parasitic capacitance.

In one example, the data conversion circuit is configured to operate as a serializer. In another example, the data conversion circuit is configured to operate as a deserializer.

In some implementations, the first data may be delayed to provide a plurality of delayed versions of the first data to corresponding groups of cascaded flipflops. Each group of cascaded flipflops may have two or more dynamic flipflops. Each group of cascaded flipflops may have two or more static flipflops.

In one example, the first mode of operation for the data conversion circuit is selected when the clock signal has a frequency that exceeds 1 GHz. In some implementations, the first mode of operation for the data conversion circuit is selected for clock signal frequencies that are less 1 GHz. In another example, the first mode of operation for the data conversion circuit is selected when the clock signal has a frequency that exceeds 4 GHZ.

The method illustrated in FIG. 12 may be executed in or using an IC device. In one example, the IC device comprises an SoC. In another example, the IC device is included in one of multiple semiconductor dice mounted on a substrate. The IC device may be implemented as a chiplet in some instances.

The IC device may include a bus interface. The bus interface may include a data conversion circuit. The data conversion circuit may have first and second cascaded flipflops and at least one selection circuit. The first cascaded flipflops may include series-coupled dynamic flipflops configured or arranged in a circuit that can convert first data to second data. Each dynamic flipflop may be configured to retain signaling state of its output based on a capacitance at its input. In one example, the capacitance at the input of each dynamic flipflop is provided by parasitic capacitance. The second cascaded flipflops may include series-coupled static flipflops configured or arranged in a circuit that can convert the first data to the second data. Each static flipflop may be configured to retain signaling state of its output through a feedback circuit that actively drives its input. A first selection circuit may be configured to select between an output of the first cascaded flipflops and an output of the second cascaded flipflops to provide the second data. Selection may be made based on the frequency of a clock signal that controls a rate at which data is shifted through the data conversion circuit.

In some implementations, data conversion circuit has a second selection circuit. The second selection circuit may be configured to select between an input of the first cascaded flipflops and an input of the second cascaded flipflops to receive the first data. Selection may be made based on the frequency of the clock signal that controls the rate at which data is shifted through the data conversion circuit.

In some implementations, each of the first cascaded flipflops has a dynamic flipflop portion that is series-coupled to a static flipflop portion. In some implementations, the data conversion circuit is configured to operate as a serializer. In other implementations, the data conversion circuit is configured to operate as a deserializer.

In certain implementations, the data conversion circuit includes delay circuits configured to provide a plurality of delayed versions of the first data to corresponding groups of cascaded flipflops. Each group of cascaded flipflops may include two or more dynamic flipflops. Each group of cascaded flipflops may include two or more static flipflops.

In one example, the second mode of operation for the data conversion circuit is selected when the clock signal has a frequency that is less than 1 GHz. In some implementations, the second mode of operation for the data conversion circuit is selected for clock signal frequencies that are greater than 1 GHz. In another example, the second mode of operation for the data conversion circuit is selected when the clock signal has a frequency that is less than 4 GHZ.

Some implementation examples are described in the following numbered clauses:

1. A data conversion circuit, comprising: first cascaded flipflops comprising a plurality of series-coupled dynamic flipflops configured to convert first data to second data, each dynamic flipflop being configured to retain signaling state of its output based on a capacitance at its input; second cascaded flipflops comprising a plurality of series-coupled static flipflops configured to convert the first data to the second data, each static flipflop being configured to retain signaling state of its output through a feedback circuit that actively drives its input; and a first selection circuit configured to select between an output of the first cascaded flipflops and an output of the second cascaded flipflops to provide the second data based on frequency of a clock signal that controls a rate at which data is shifted through the data conversion circuit.

2. The data conversion circuit as described in clause 1, further comprising: a second selection circuit configured to select between an input of the first cascaded flipflops and an input of the second cascaded flipflops to receive the first data based on the frequency of the clock signal that controls the rate at which data is shifted through the data conversion circuit.

3. The data conversion circuit as described in clause 1 or clause 2, wherein each of the first cascaded flipflops comprises a dynamic flipflop portion that is series-coupled to a static flipflop portion.

4. The data conversion circuit as described in any of clauses 1-3, wherein the capacitance at the input of each dynamic flipflop comprises a parasitic capacitance.

5. The data conversion circuit as described in any of clauses 1-4, wherein the data conversion circuit is configured to operate as a serializer.

6. The data conversion circuit as described in any of clauses 1-4, wherein the data conversion circuit is configured to operate as a deserializer.

7. The data conversion circuit as described in any of clauses 1-6, further comprising: delay circuits configured to provide a plurality of delayed versions of the first data to corresponding groups of cascaded flipflops.

8. The data conversion circuit as described in clause 7, wherein each group of cascaded flipflops comprises two or more dynamic flipflops or two or more static flipflops.

9. The data conversion circuit as described in any of clauses 1-8, wherein the first selection circuit is configured to select the output of the first cascaded flipflops to provide the output of the data conversion circuit when the clock signal has a frequency that exceeds 1 GHz.

10. A method for configuring a data conversion circuit, comprising: selecting a mode of operation for the data conversion circuit based on frequency of a clock signal that controls a rate at which data is to be shifted through the data conversion circuit; enabling first cascaded flipflops to convert first data to second data in a first mode of operation, the first cascaded flipflops comprising a plurality of series-coupled dynamic flipflops, each dynamic flipflop being configured to retain signaling state of its output based on a capacitance at its input; configuring a first selection circuit to select an output of the first cascaded flipflops as an output of the data conversion circuit in the first mode of operation; enabling second cascaded flipflops to convert the first data to the second data in a second mode of operation, the second cascaded flipflops comprising a plurality of series-coupled static flipflops, each static flipflop being configured to retain signaling state of its output through a feedback circuit that actively drives its input; and configuring the first selection circuit to select an output of the second cascaded flipflops as the output of the data conversion circuit in the second mode of operation.

11. The method as described in clause 10, further comprising: configuring a second selection circuit to provide the first data to an input of the first cascaded flipflops when the data conversion circuit is operated in the first mode of operation; and configuring the second selection circuit to provide the first data to an input of the second cascaded flipflops when the data conversion circuit is operated in the second mode of operation.

12. The method as described in clause 10 or claim 11, wherein each of the first cascaded flipflops comprises a dynamic flipflop portion that is series-coupled to a static flipflop portion.

13. The method as described in any of clauses 10-12, wherein the capacitance at the input of each dynamic flipflop includes a parasitic capacitance.

14. The method as described in any of clauses 10-13, wherein the data conversion circuit is configured to operate as a serializer.

15. The method as described in any of clauses 10-13, wherein the data conversion circuit is configured to operate as a deserializer.

16. The method as described in any of clauses 10-15, further comprising: delaying the first data to provide a plurality of delayed versions of the first data to corresponding groups of cascaded flipflops.

17. The method as described in clause 16, wherein each group of cascaded flipflops comprises two or more dynamic flipflops or two or more static flipflops.

18. The method as described in any of clauses 10-17, wherein the first mode of operation for the data conversion circuit is selected when the clock signal has a frequency that exceeds 1 GHz.

19. An apparatus, comprising: means for selecting between first cascaded flipflops and second cascaded flipflops to convert first data to second data; and means for selecting an output of a data conversion circuit from an output of the first cascaded flipflops and an output of the second cascaded flipflops, wherein the first cascaded flipflops comprises a plurality of series-coupled dynamic flipflops, each dynamic flipflop being configured to retain signaling state of its output based on a capacitance at its input, wherein the second cascaded flipflops comprises a plurality of series-coupled static flipflops, each static flipflop being configured to retain signaling state of its output through a feedback circuit that actively drives its input, and wherein the means for selecting between first cascaded flipflops and second cascaded flipflops and the means for selecting the output of a data conversion circuit are controlled by a signal indicating frequency of a clock signal that controls a rate at which data is to be shifted through the data conversion circuit.

20. The apparatus as described in clause 19, further comprising: a plurality of delay circuits configured to provide a plurality of delayed versions of the first data, each delayed version of the first data being provided to a corresponding group of cascaded flipflops.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A data conversion circuit, comprising:
    first cascaded flipflops comprising a plurality of series-coupled dynamic flipflops configured to convert first data to second data, each dynamic flipflop being configured to retain signaling state of its output based on a capacitance at its input;
    second cascaded flipflops comprising a plurality of series-coupled static flipflops configured to convert the first data to the second data, each static flipflop being configured to retain signaling state of its output through a feedback circuit that actively drives its input; and
    a first selection circuit configured to select between an output of the first cascaded flipflops and an output of the second cascaded flipflops to provide the second data based on frequency of a clock signal that controls a rate at which data is shifted through the data conversion circuit.

2. The data conversion circuit of claim 1, further comprising:
    a second selection circuit configured to select between an input of the first cascaded flipflops and an input of the second cascaded flipflops to receive the first data based on the frequency of the clock signal that controls the rate at which data is shifted through the data conversion circuit.

3. The data conversion circuit of claim 1, wherein each of the first cascaded flipflops comprises a dynamic flipflop portion that is series-coupled to a static flipflop portion.

4. The data conversion circuit of claim 1, wherein the capacitance at the input of each dynamic flipflop comprises a parasitic capacitance.

5. The data conversion circuit of claim 1, wherein the data conversion circuit is configured to operate as a serializer.

6. The data conversion circuit of claim 1, wherein the data conversion circuit is configured to operate as a deserializer.

7. The data conversion circuit of claim 1, further comprising:
    delay circuits configured to provide a plurality of delayed versions of the first data to corresponding groups of cascaded flipflops.

8. The data conversion circuit of claim 7, wherein each group of cascaded flipflops comprises two or more dynamic flipflops or two or more static flipflops.

9. The data conversion circuit of claim 1, wherein the first selection circuit is configured to select the output of the first cascaded flipflops to provide the output of the data conversion circuit when the clock signal has a frequency that exceeds 1 GHz.

10. A method for configuring a data conversion circuit, comprising:

selecting a mode of operation for the data conversion circuit based on frequency of a clock signal that controls a rate at which data is to be shifted through the data conversion circuit;

enabling first cascaded flipflops to convert first data to second data in a first mode of operation, the first cascaded flipflops comprising a plurality of series-coupled dynamic flipflops, each dynamic flipflop being configured to retain signaling state of its output based on a capacitance at its input;

configuring a first selection circuit to select an output of the first cascaded flipflops as an output of the data conversion circuit in the first mode of operation;

enabling second cascaded flipflops to convert the first data to the second data in a second mode of operation, the second cascaded flipflops comprising a plurality of series-coupled static flipflops, each static flipflop being configured to retain signaling state of its output through a feedback circuit that actively drives its input; and configuring the first selection circuit to select an output of the second cascaded flipflops as the output of the data conversion circuit in the second mode of operation.

11. The method of claim 10, further comprising:

configuring a second selection circuit to provide the first data to an input of the first cascaded flipflops when the data conversion circuit is operated in the first mode of operation; and configuring the second selection circuit to provide the first data to an input of the second cascaded flipflops when the data conversion circuit is operated in the second mode of operation.

12. The method of claim 10, wherein each of the first cascaded flipflops comprises a dynamic flipflop portion that is series-coupled to a static flipflop portion.

13. The method of claim 10, wherein the capacitance at the input of each dynamic flipflop includes a parasitic capacitance.

14. The method of claim 10, wherein the data conversion circuit is configured to operate as a serializer.

15. The method of claim 10, wherein the data conversion circuit is configured to operate as a deserializer.

16. The method of claim 10, further comprising:

delaying the first data to provide a plurality of delayed versions of the first data to corresponding groups of cascaded flipflops.

17. The method of claim 16, wherein each group of cascaded flipflops comprises two or more dynamic flipflops or two or more static flipflops.

18. The method of claim 10, wherein the first mode of operation for the data conversion circuit is selected when the clock signal has a frequency that exceeds 1 GHz.

19. An apparatus, comprising:

means for selecting between first cascaded flipflops and second cascaded flipflops to convert first data to second data; and means for selecting an output of a data conversion circuit from an output of the first cascaded flipflops and an output of the second cascaded flipflops, wherein the first cascaded flipflops comprises a plurality of series-coupled dynamic flipflops, each dynamic flipflop being configured to retain signaling state of its output based on a capacitance at its input, wherein the second cascaded flipflops comprises a plurality of series-coupled static flipflops, each static flipflop being configured to retain signaling state of its output through a feedback circuit that actively drives its input, and wherein the means for selecting between first cascaded flipflops and second cascaded flipflops and the means for selecting the output of a data conversion circuit are controlled by a signal indicating frequency of a clock signal that controls a rate at which data is to be shifted through the data conversion circuit.

20. The apparatus of claim 19, further comprising:

a plurality of delay circuits configured to provide a plurality of delayed versions of the first data, each delayed version of the first data being provided to a corresponding group of cascaded flipflops.

\*    \*    \*    \*    \*